United States Patent [19]

Ohta

[11] Patent Number: 5,414,635

[45] Date of Patent: May 9, 1995

[54] OSCILLOSCOPE WITH DYNAMIC TRIGGERING DETERMINATION

[75] Inventor: Genichiro Ohta, Ebina, Japan

[73] Assignee: Matsushita Electric Industrial Co., Ltd., Osaka, Japan

[21] Appl. No.: 970,400

[22] Filed: Nov. 2, 1992

[30] Foreign Application Priority Data

Nov. 8, 1991 [JP] Japan ................................ 3-293484
Nov. 8, 1991 [JP] Japan ................................ 3-293485
Nov. 8, 1991 [JP] Japan ................................ 3-293486
Nov. 8, 1991 [JP] Japan ................................ 3-293487
Nov. 8, 1991 [JP] Japan ................................ 3-293489

[51] Int. Cl.6 ........................................... G01R 13/28
[52] U.S. Cl. ................................... 364/481; 364/484; 364/487; 364/274.6; 395/61; 395/900
[58] Field of Search .............. 364/480, 481, 483, 484, 364/485, 486, 487, 507, 274.6; 324/121 R; 395/61, 900

[56] References Cited

U.S. PATENT DOCUMENTS 4,755,951  7/1988  Hollister .............................. 364/487
5,119,018  6/1992  Katayama et al. ............... 324/121 R
5,153,501  10/1992  Shinada et al. .................. 324/121 R
5,184,062  2/1993  Ladwig ............................ 324/121 R

OTHER PUBLICATIONS

John Novellino, "Scopes Combine Digital Power with Ease of Use" Electronic Design, vol. 39, No. 12, pp. 131–134, Jun. 27, 1991.

Nikkei Electronics, vol. 427, pp. 115–124, Aug. 10, 1987.

Primary Examiner—Emanuel T. Voeltz
Assistant Examiner—Craig Steven Miller
Attorney, Agent, or Firm—Stevens, Davis, Miller & Mosher

[57] ABSTRACT

An oscilloscope in which an observer is freed from the troubles of triggering operations. Further, the processing speed of the oscilloscope is high, the number of errors is small, and it is also adequate to use a small memory capacity. Main period components included in a signal to be observed are extracted, waveforms regarding the extracted period components and information indicating with which period components the waveforms are triggered are displayed. The trigger can be varied to operate in response to other period components and the sweep time also can be varied.

12 Claims, 21 Drawing Sheets

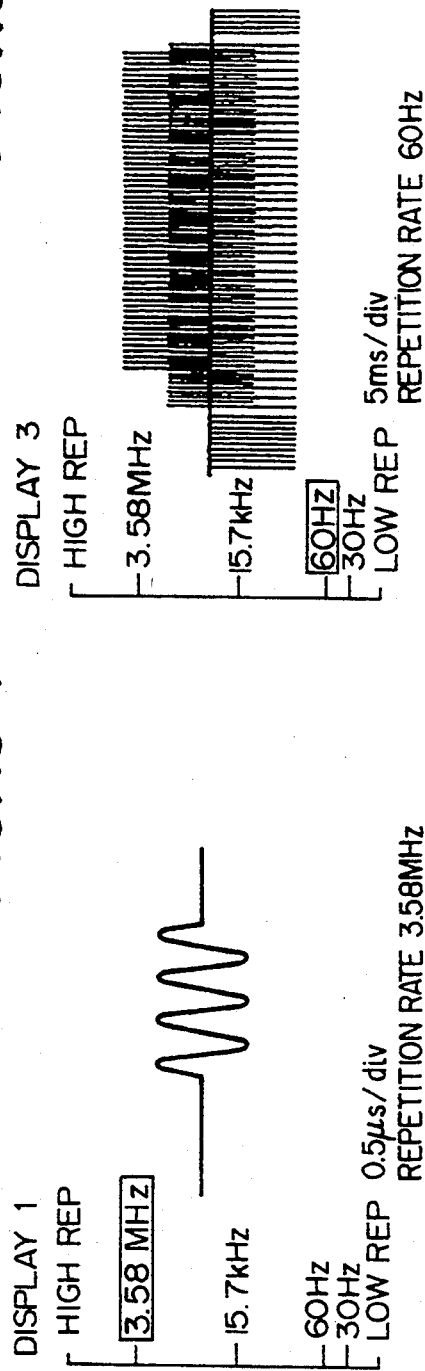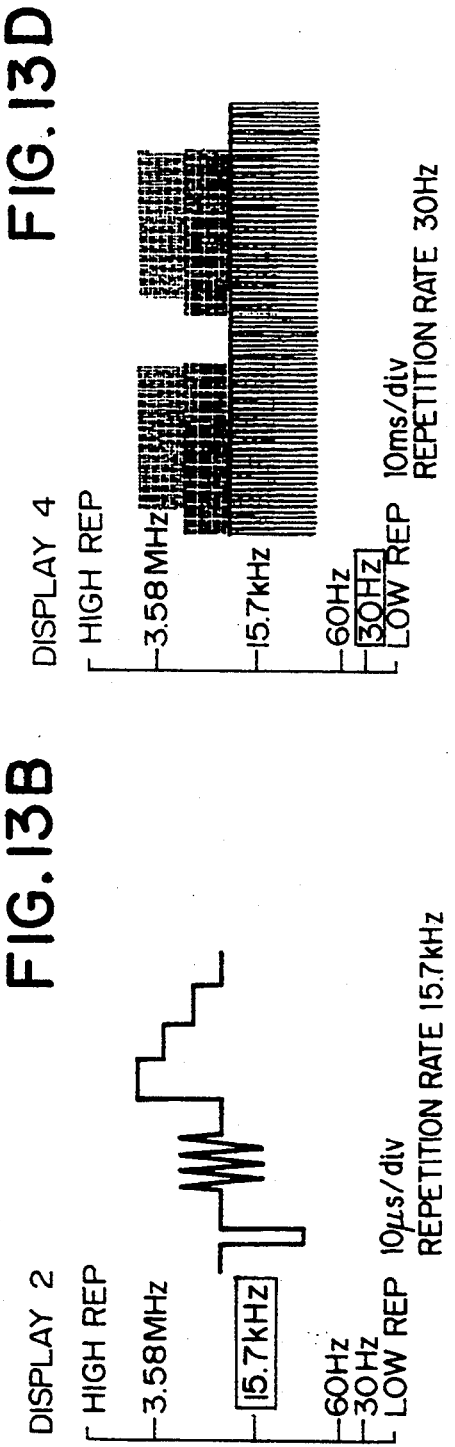

AUTO TRIGGERING MULTI-DISPLAY FOR USER CHOICE

DISPLAY 1  0.2μs/div
REPETITION RATE 3.58MHz

DISPLAY 2  10μs/div
REPETITION RATE 15.7 kHz

DISPLAY 3  5ms/div
REPETITION RATE 60Hz

DISPLAY 4  10ms/div
REPETITION RATE 30Hz

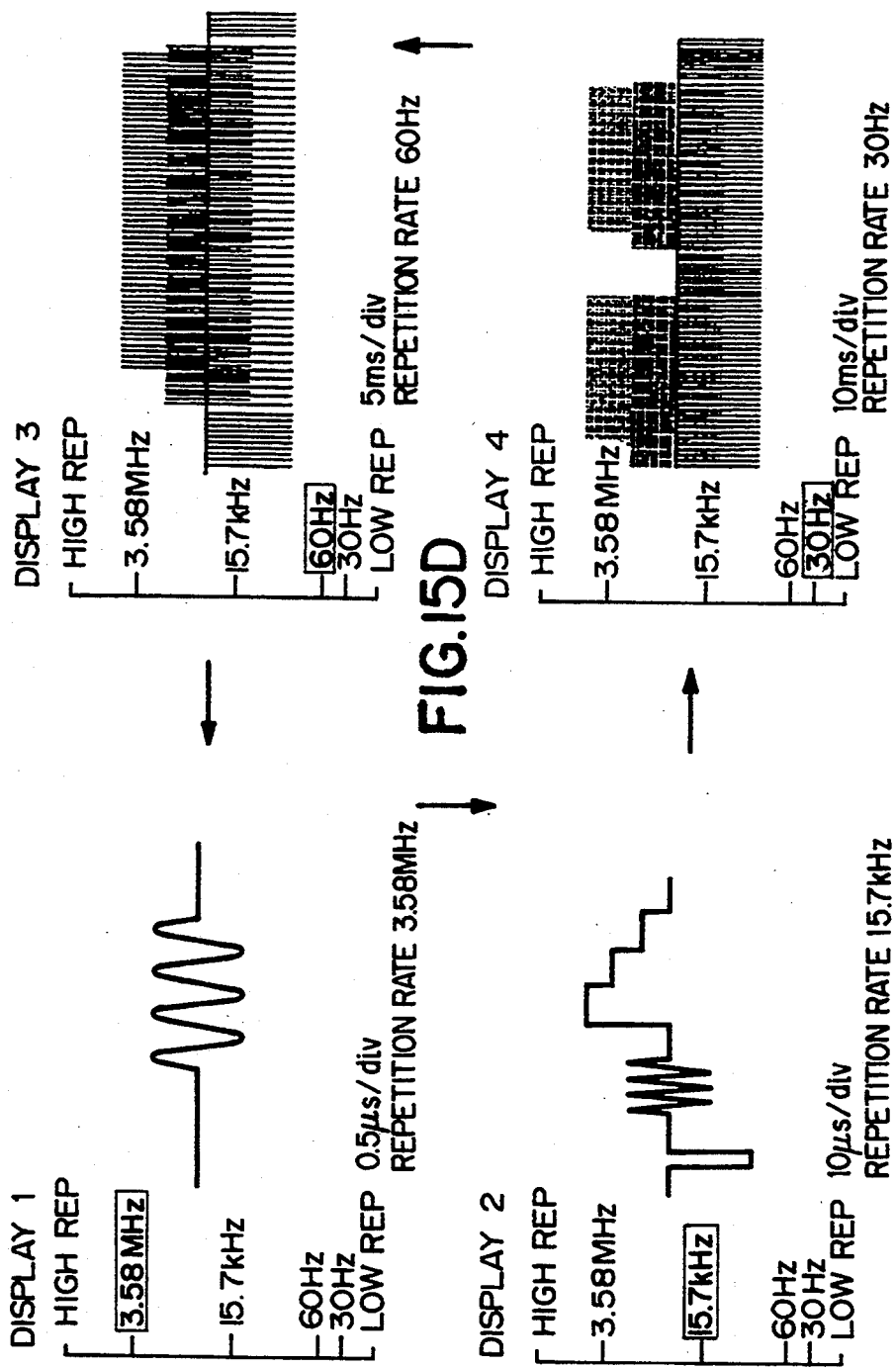

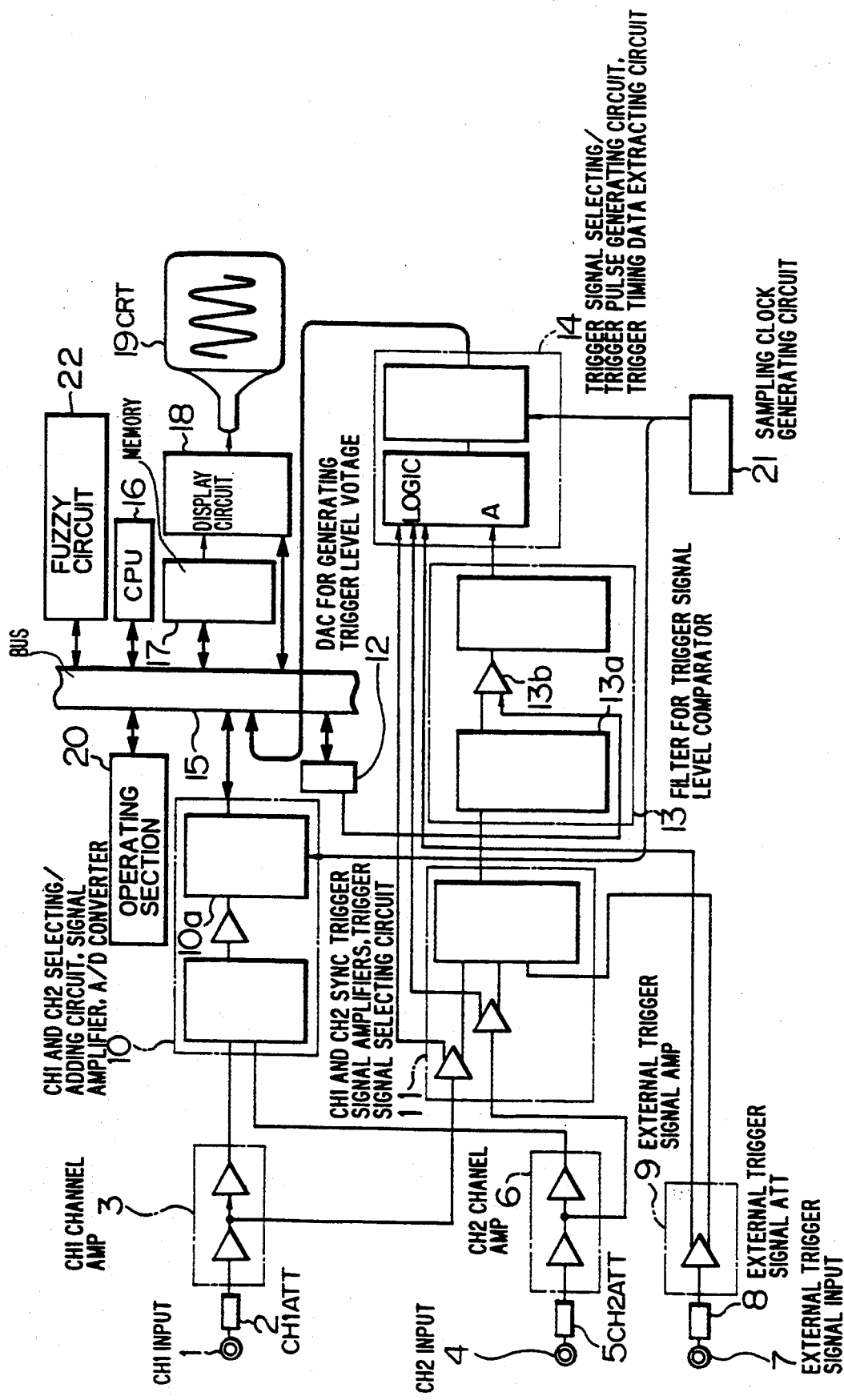

F I G. 17
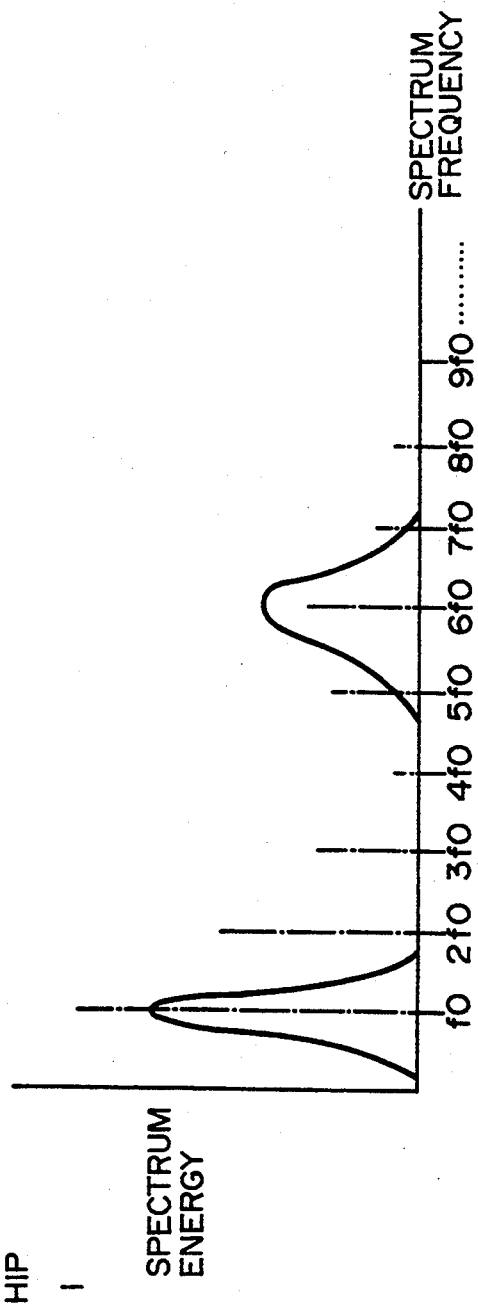
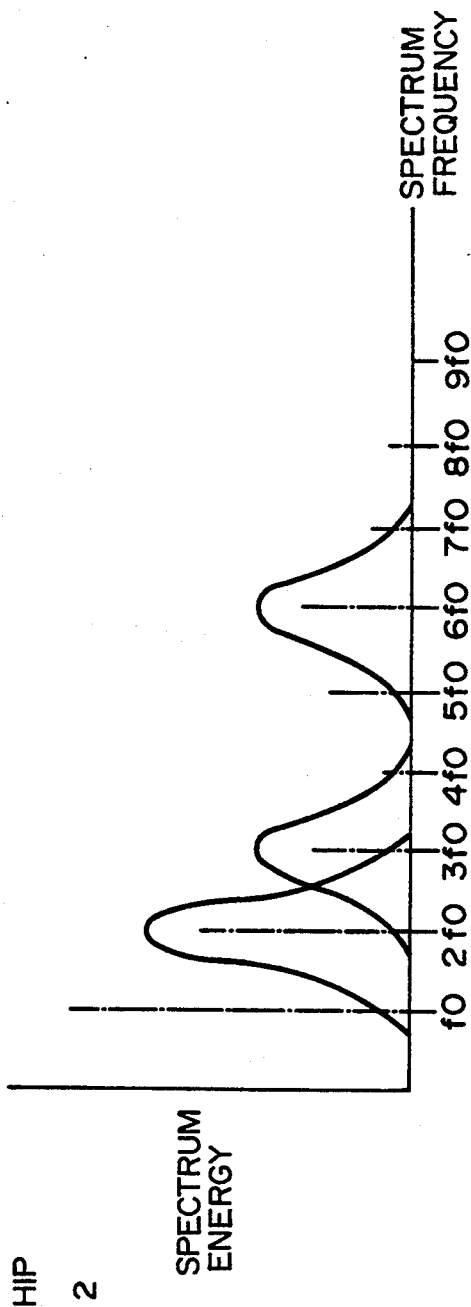

OSCILLOSCOPE WITH DYNAMIC TRIGGERING DETERMINATION

BACKGROUND OF THE INVENTION

The invention relates to an oscilloscope for observing unspecific electric signals.

Generally, in oscilloscopes for observing unspecific electric signal waveforms, it is necessary that the user himself analyzes a feature of a waveform to be observed and manually executes operations such as selection of a trigger signal, separation of components, selection of waveform shaping conditions, matching of timings, and the like.

However, the triggering operation requires a fairly large amount of knowledge, and is subject to a certain kind of contradiction. That is, when there is a need to observe an electric signal, sometimes the signal which will be observed cannot be predicted. Therefore, the requirement that the triggering conditions be previously presumed and determined with respect to the case where the signal to be observed is unknown is contradictory and difficult. For the beginner, such a requirement results in a remarkable difficult problem in that the erroneous execution of the measurement may cause a lack of propriety of the judgment (display). Therefore, among recent measuring instruments, there is also a measuring instrument which operates such that the state, after completion of the operation setting, is read out from an operation panel and preserved as data in a storage device. There is also a measuring instrument which is designed such that when it is appropriate to set the same operation parameters for a subsequent observation, the preserved data is read out from the storage device and is electronically automatically set. An example of such a measuring instrument is disclosed in "ELECTRONIC DESIGN", Vol. 39, No 12, pages 131, Jun. 27, 1991.

However, there is a problem with the above-arrangement, since measuring instruments are used to observe a number of various unspecific electric phenomena and thus it is hardly actually useful to provide a measuring instrument which can store a limited number of conditions.

SUMMARY OF THE INVENTION

It is an object of the invention to solve such conventional problems and to provide an excellent oscilloscope in which the observer is freed from the troubles of triggering operations, a high processing speed is obtained, the number of errors is small, and it is also sufficient to use a small memory capacity.

The above object of the invention is accomplished by a first device comprising: means for extracting main period components included in a signal to be observed; means for displaying on a screen a waveform of one of the extracted period components and information indicating with which period component the waveform was triggered; and means for triggering with a different period component and switching a sweep rate by an input from an operating section.

According to the above-described first device, since various period components in the signal to be observed can be automatically extracted and displayed, the triggering setting for an unspecific electric signal can be easily performed. Further, since such a process can be fundamentally executed in hardware, there are excellent advantages such that the processing speed is high, the number of errors is small, a CPU and software program can be simply constructed, and it is also sufficient to use a small memory capacity.

The above object of the invention is also accomplished by a second device comprising: means for extracting a main period component included in a signal to be observed on a screen; means for displaying, on the same screen, a waveform of each of a plurality of period components among the extracted period components and information indicating with which period component each waveform is triggered; and means for triggering based on another of the plurality of period components and switching a sweep rate in response to an input from an operating section.

According to the second device, since various period components of a plurality of types in the signal to be observed can be automatically extracted and displayed, the triggering setting and the observation of an unspecific electric signal can be easily performed. Further, since such a process can be fundamentally executed in hardware, there are excellent advantages such that the processing speed is high, the number of errors is small, a CPU and software program can be simply constructed, and it is also sufficient to use a small memory capacity.

The above object of the invention is also accomplished by a third device comprising: means for extracting main period components included in a signal to be observed; means for sequentially displaying, on a screen, a waveform for each of the extracted period components and information indicating with which period component each waveform is triggered; and means for fixing or returning the display screen by an input from an operating section.

According to the third device, since various period components in the signal to be observed can be extracted and sequentially displayed, the triggering setting of an unspecific electric signal can be easily performed. Further, since such a process can be fundamentally executed in hardware, there are excellent advantages such that the processing speed is high, the number of errors is small, a CPU and software program can be simply constructed, and it is also sufficient to use a small memory capacity.

The above object of the invention is also accomplished by a fourth device comprising: means for extracting main period components included in a signal to be observed; means for determining an optimum triggering condition by a predetermined membership function with respect to each of the extracted period components in accordance with Fuzzy Logic; and means for displaying, on a screen, a waveform for the period component whose triggering condition has been determined together with the triggering condition.

According to the fourth device, since various period components in the signal to be observed can be automatically extracted and its triggering condition can be determined by Fuzzy Logic and displayed, the triggering setting of an unspecific electric signal can be easily performed. Further, since such a process can be fundamentally executed in hardware, there are excellent advantages such that the processing speed is high, the number of errors is small, a CPU and software program can be simply constructed, and it is also sufficient to use a small memory capacity.

The above object of the invention is further accomplished by a fifth device comprising: means for extracting main period components included in a signal to be observed; and means for obtaining optimum conditions for the trigger and waveform display with respect to each of the extracted period components and for supplying a teaching signal from an operating section to the waveform displayed on a screen, thereby learning the optimum conditions for the trigger and the waveform display.

According to the fifth device, since various period components in the signal to be observed are automatically extracted and the optimum conditions for the trigger and the waveform display are learned, the triggering setting of an unspecific electric signal can be easily performed. Further, since such a process can be fundamentally executed in hardware, there are excellent advantages such that the processing speed is high, the number of errors is small, a CPU and a program software can be simply constructed, and it is also sufficient to use a small memory capacity.

BRIEF DESCRIPTION OF THE DRAWINGS

FIG. 13 is a display screen diagram showing examples of CRT display screens in the first, fourth, and fifth embodiments of the invention;

FIG. 15 is a display screen diagram showing an example of the CRT display screen in the third embodiment of the invention;

FIG. 16 is a block diagram of an oscilloscope showing the fourth embodiment of the invention;

FIG. 17 is a frequency characteristic diagram showing examples of membership functions of a fuzzy logic circuit in the fourth embodiment of the invention;

DESCRIPTION OF THE PREFERRED EMBODIMENTS (Embodiment 1)

Figure 1:
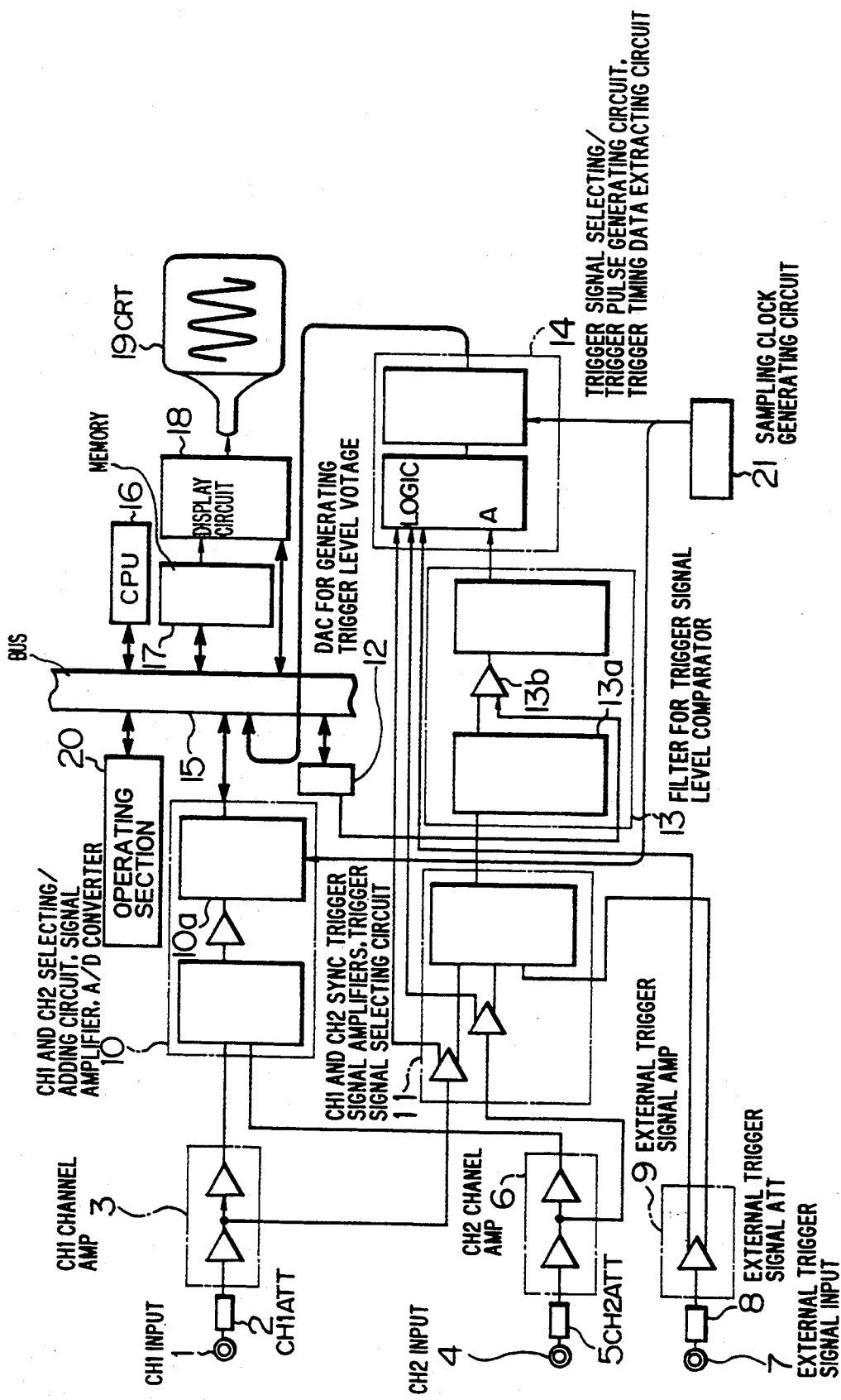
FIG. 1 is a block diagram of an oscilloscope showing the first, second, and third embodiments of the invention.

An embodiment of the invention will be described hereinbelow with reference to the drawings. FIG. 1 shows a construction of the first embodiment of the invention. In FIG. 1, reference numeral 1 denotes a CH1 input; 2 a CH1 ATT (channel 1 attenuator); 3 a CH1 channel amplifier; 4 a CH2 input; 5 a CH2 ATT (channel 2 attenuator); 6 a CH2 channel amplifier; 7 an external trigger signal input; 8 an external trigger signal ATT; 9 an external trigger signal amplifier; 10 a circuit section comprising a CH1/CH2 selecting/adding circuit, signal amplifiers, and an A/D converter; 11 a circuit section comprising CH1 and CH2 trigger signal amplifiers and a trigger signal selecting circuit; 12 a DAC (digital-to-analog converter) for generating a trigger level voltage; 13 a circuit section comprising a filter for the trigger signal, a level comparator, and the like; 14 a circuit section comprising a trigger signal selecting/trigger pulse generating circuit and a trigger timing data extracting circuit; 15 a bus; 16 a CPU; 17 a memory; 18 a display circuit; 19 a CRT; 20 an operating section; and 21 a sampling clock generating circuit.

The operation of the above embodiment will now be described. A signal to be observed is supplied to the CH1 input 1 or CH2 input 4 and is adjusted by an attenuator of the CH1 ATT 2 or CH2 ATT 5 so as to have a desired amplitude. An output of the CH1 ATT 2 or CH2 ATT 5 is supplied to the CH1 channel amplifier 3 or CH2 channel amplifier 6 and is subjected to necessary amplification. Next, the amplified signal is sent to the circuit section 10 comprising the CH1/CH2 selecting/adding circuit, signal amplifier, and A/D converter. The selected or synthesized result is converted into a digital signal by an A/D converter 10a. The digital signal passes through the bus 15 and is sent to the CPU 16 and stored into the memory 17.

On the other hand, either the signals obtained from the channel CH1 and CH2 inputs 1 and 4 or the trigger signal obtained from the external trigger signal input 7 is selected by the circuit section 11 comprising the CH1 and CH2 trigger signal amplifiers and the trigger signal selecting circuit. Next, the selected signal is supplied to the circuit section 13 comprising the filter for the trigger signal, level comparator, and the like. A comparison voltage is supplied from the trigger level voltage generating DAC 12 to a comparison signal input terminal of a level comparator 13b. All of the trigger features included in the trigger signal pass through a filter 13a for the trigger signal. After that, by changing the comparison voltage within a range of the whole signal amplitude, the trigger features are extracted. In the output of the level comparator 13b, trigger timing information is detected by the high speed circuit section 14 comprising the trigger signal selecting/trigger pulse generating circuit and the trigger timing data extracting circuit and is sent as data to the CPU 16 via the bus 15. The data is stored into the memory 17. The waveform data stored in the memory 17 is supplied to the display circuit 18 in accordance with a command from the CPU 16. The waveform of one extracted period component is displayed on the screen of the CRT (cathode ray tube) 19. Information of a triggering condition and a sweep rate indicating with which period component the displayed waveform is triggered is also displayed. On the other hand, when the displayed waveform is not the waveform which the observer wants to observe, the CPU 16 is switched to the waveform of another period component, triggering condition, and sweep rate which have been stored as a data set in the memory 17 by key input, regarding the triggering conditions and sweep rate, from the operating section 20 by the observer and allows them to be displayed on tho screen of the CRT 19 through the display circuit 18.

Explanation will now be made with respect to the filter 13a for the trigger signal and the level comparator 13b as means for extracting the main period components included in a signal to be observed and as one of the main sections of the invention. The extraction of the period components by the level comparator 13b will be first described.

Figure 2:
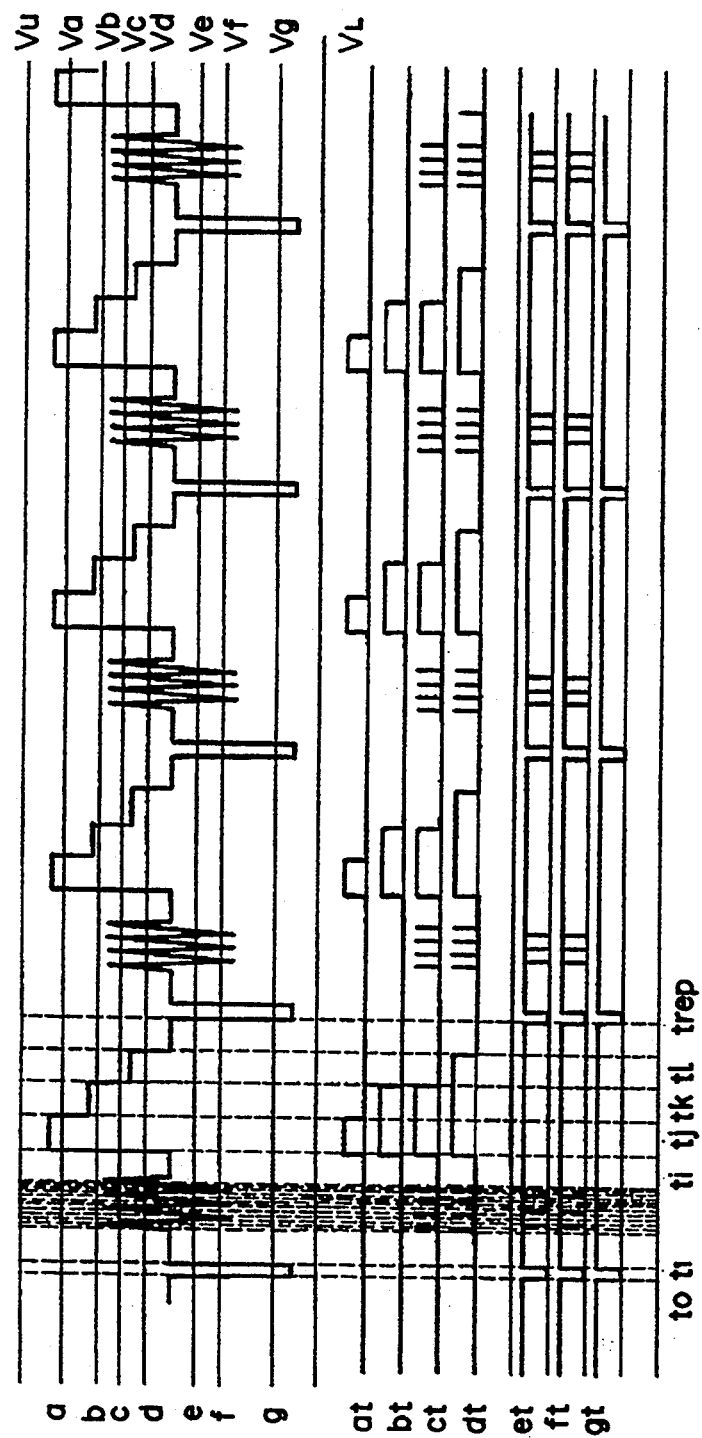
FIG. 2 is a signal waveform diagram showing the difference of the generation of a trigger pulse due to the difference of a trigger level voltage in the first embodiment of the invention.
Figure 3:
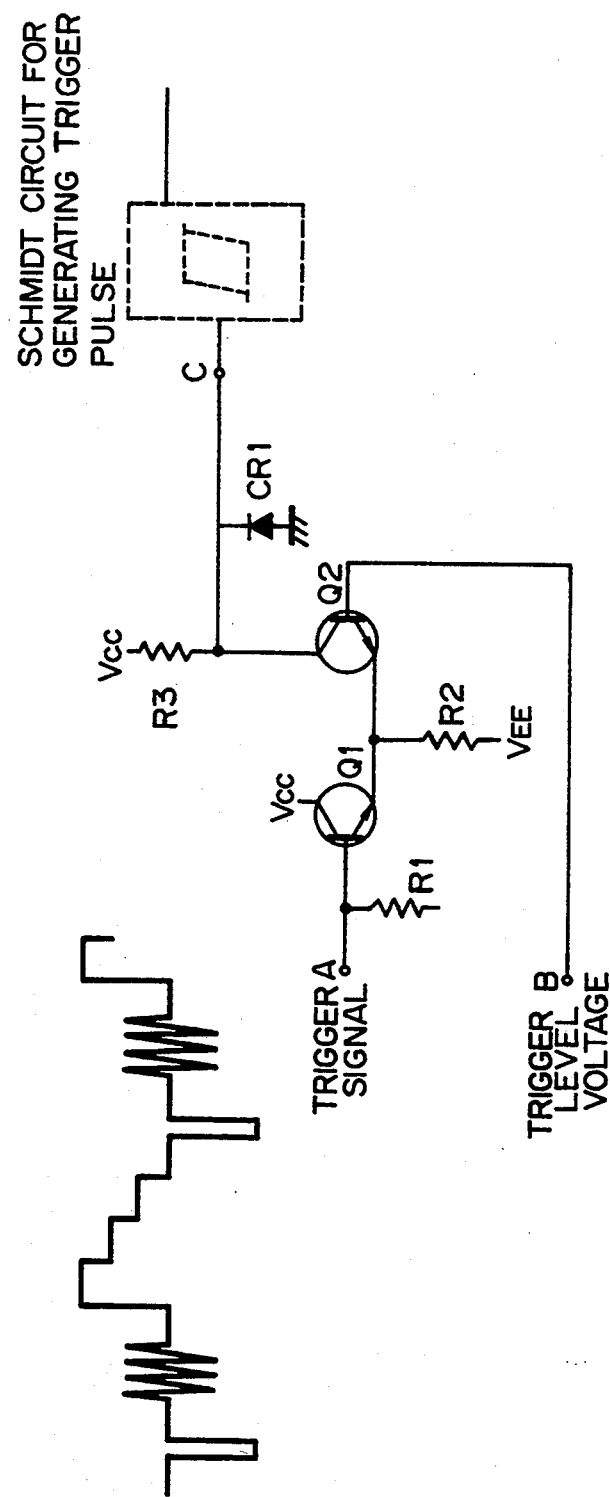
FIG. 3 is a block diagram of a voltage comparator corresponding to a level comparator for extracting period components in the first embodiment of the invention.

In the triggering operation of the oscilloscope, it is most necessary to extract periodic features included in the trigger signal. FIG. 2 shows that the periodicity of the signal is varied by changing the comparison voltage of the level comparator by using a television signal, as an example. It is now considered that a level of trigger signal lies within a range between voltage levels $V_u$ and $V_L$ as shown in FIG. 2. Such a trigger signal is supplied to one input terminal A of a voltage comparator (level comparator) comprising a pair of transistor groups, as shown in FIG. 3. A trigger level voltage for comparison is supplied to another input terminal B of the voltage comparator. It is now assumed that an output in this instance is taken out from an output terminal C connected to a collector of a transistor $Q_2$. While changing the voltage level for comparison to $V_a$, $V_b$, $V_c$, $V_d$, $V_e$, $V_f$, and $V_g$ as shown in FIG. 2, signals of waveforms are obtained as shown at positions of $a_t$, $b_t$, $c_t$, $d_t$, $e_t$, $f_t$, and $f_g$, shown in the lower left portion of FIG. 2 in correspondence to those voltage levels. It will be understood that the outputs whose comparison voltage levels are equal to $V_a$, $V_b$, and $V_g$ clearly have the same period, although their pulse widths are different. A response for a color burst signal is included in the outputs corresponding to $V_c$, $V_d$, $V_e$, and $V_f$ and those outputs are more complicated. Therefore, it will be understood that in the range shown in FIG. 2, by setting the comparison voltage level to either one of $V_a$, $V_b$, and $V_g$, the period component suitable for the trigger can be taken out from the output of a comparator shown in FIG. 3.

FIG. 2 does not include all of the images of one picture plane of the television signal.

Figure 4:
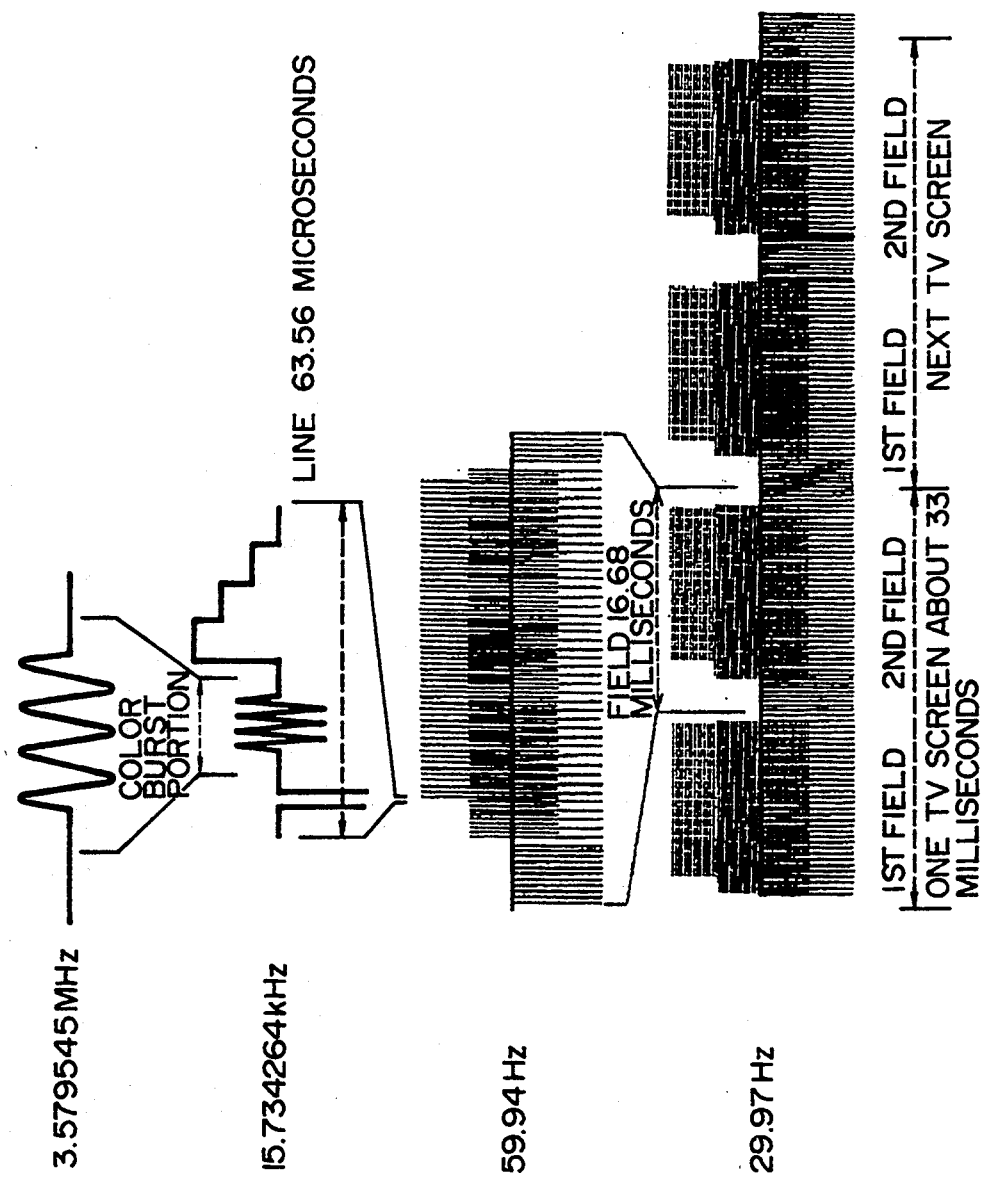
FIG. 4 is a signal waveform diagram showing the complexity of period components which are seen in a television signal in the first embodiment of the invention.

Therefore, the entire periodicity signal of the television signal cannot be known completely from only FIG. 2. FIG. 4 shows images of two picture planes of television signals and it will be understood that one picture plane has a width of about 33 milliseconds. That is, a repetition frequency of the picture plane is equal to about 30 Hz. One picture plane comprises two fields because an interlaced scanning method is used. Therefore, a field repetition frequency is equal to about 60 Hz. Since one picture plane is constructed by 525 lines, a line repetition frequency is equal to about 15750 Hz and its period is equal to about 63.5 microseconds. FIG. 2 shows such a line signal in the range of five lines. Since the color burst signal for controling a color signal is added in one line, the partial highest frequency component is set to about 3.58 MHz as a frequency of the color burst signal. That is, its period is equal to about 280 nanoseconds.

Figure 5:
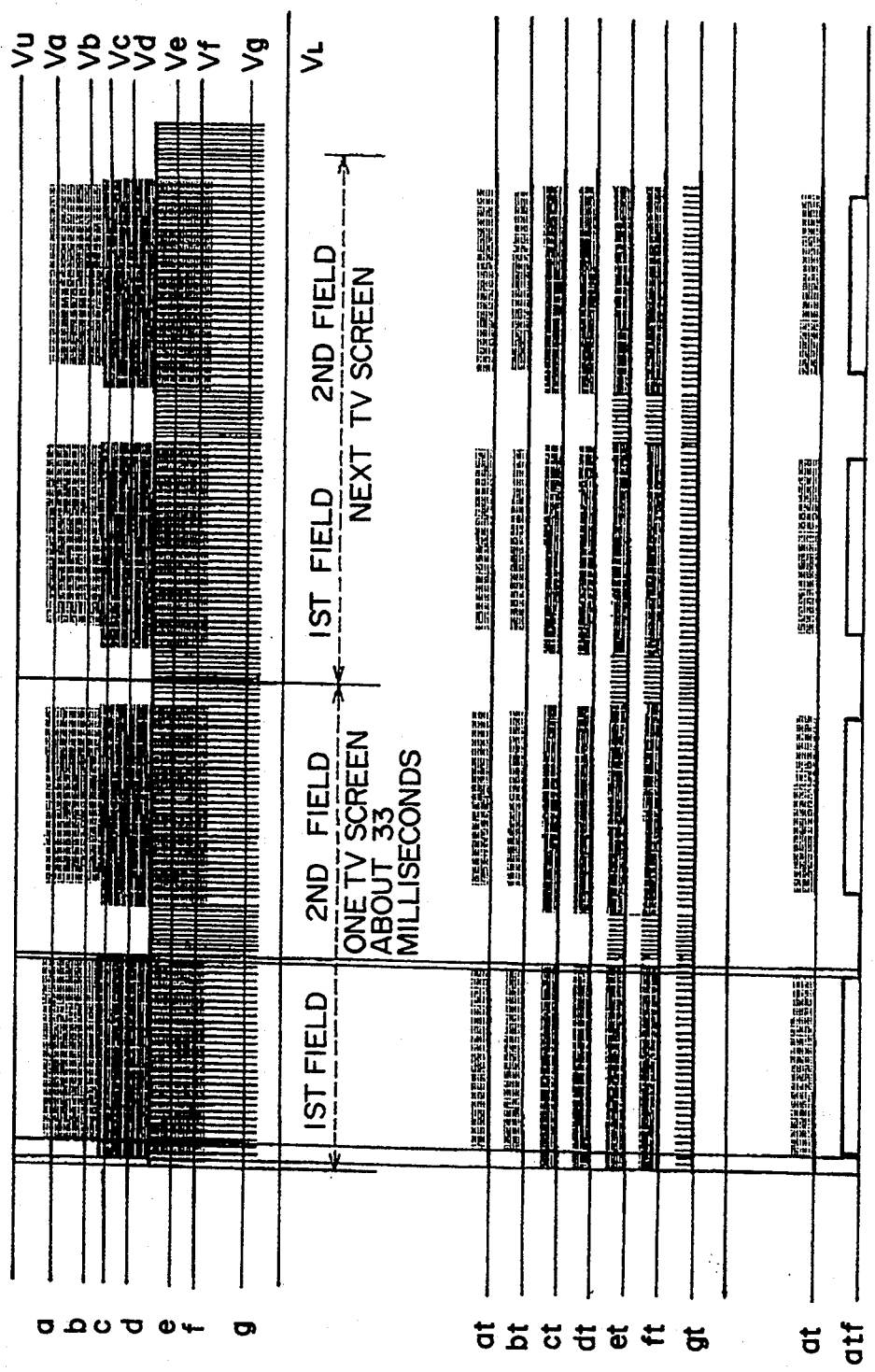
FIG. 5 is a signal waveform diagram showing the difference of the generation of a trigger pulse corresponding to a difference of a trigger level in the case where a television signal is viewed in a wide range in the first embodiment of the invention.

As mentioned above, recent electric signals which must be observed are very complicated. In the case of observing such an electric signal waveform, a great deal of knowledge is needed to previously set the triggering conditions. For instance, as comparison outputs of the television signal for the level voltages $V_a$ and $V_b$ of the comparator shown in FIG. 3, not only do they have the features shown in $a_t$ and $b_t$ in FIG. 2, but also generate pulses, having a long width, for a blanking period of the television scan signals existing in a range between the first and second fields which are seen in FIG. 4. FIG. 5 shows such a state.

In FIG. 5, $V_a$, $V_b$, $V_c$, $V_d$, $V_e$, $V_f$, and $V_g$ denote substantially the same voltages as those for comparison by the voltage comparator used in FIG. 2, and $a_t$, $b_t$, $c_t$, $d_t$, $e_t$, $f_t$, and $g_t$ shown in the lower left portion in the diagram corresponding to those voltages also indicate outputs under substantially the same condition. As will be understood from FIG. 5, by setting the comparison voltage level to either $V_a$ or $V_b$, a simple pulse train is generated as an output and no pulse change occurs in a switching period of the field. By transmitting such an output through a low pass filter, therefore, a signal component indicative of the field repetition period can be obtained. On the contrary, by transmitting the trigger signal through a high pass filter before it is supplied to the comparator, a component of the color burst signal can be taken out and by shaping such a signal by the comparator, its period can be measured.

According to the embodiment, therefore, in the level comparator 13b, which has the same construction as that of the voltage comparator shown in FIG. 3, by changing the trigger level voltage from the trigger level voltage generating DAC 12 in the range of the whole signal width, the main period components can be extracted from the signal to be observed.

Figure 6:
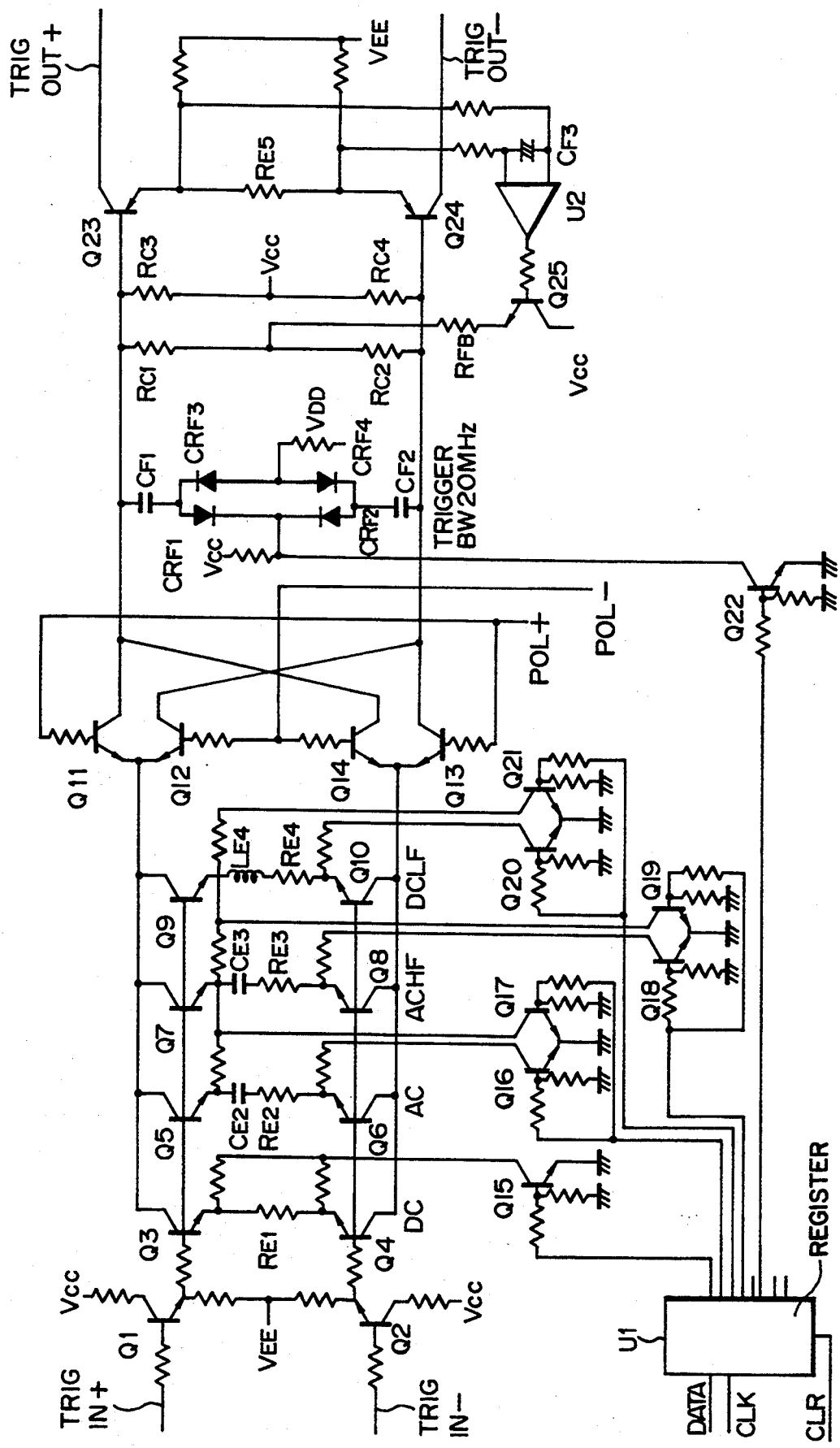
FIG. 6 is a block diagram of a filter for a trigger signal in the first embodiment of the invention.

The filter 13a for the trigger signal for extracting the period components which are extracted by the level comparator 13b, as mentioned above, from different bands of the signal to be observed will now be described in detail. FIG. 6 shows a construction of the filter 13a. The filter 13a, which receives the output of the circuit section 11 comprising the CH1 and CH2 trigger signal amplifiers and the trigger signal selecting circuit shown in FIG. 1, is ordinarily constructed as a type of amplifier in which four types of frequency characteristics can be selected. In FIG. 6, the trigger signal inputs are supplied, as TRIG IN+ and TRIG IN−, to a differential type filter circuit in the form of differential signals while maintaining noise resistant performance. Transistors $Q_1$ and $Q_2$ drive to decrease the input impedance of the filter circuit by an emitter follower arrangement as buffer amplifiers. Transistors $Q_3$ and $Q_4$ construct a common emitter type amplifier in which a feedback circuit between emitters is formed by only resistors. Transistors $Q_5$ and $Q_6$ construct a common emitter type amplifier in which a feedback circuit between emitters is formed by a capacitor having a large capacitance and a resistor. Transistors $Q_7$ and $Q_8$ construct a common emitter type amplifier in which a feedback circuit between emitters is formed by capacitor having a small capacitance and a resistor. Transistors $Q_9$ and $Q_{10}$ construct a common emitter type amplifier in which a feedback circuit between emitters is formed by an inductance and a resistor. Each of the differential amplifiers with common emitter transistors is controlled to perform the amplifying operation when only one set of either one of transistors $Q_{15}$, $Q_{16}$, $Q_{17}$, $Q_{18}$, $Q_{19}$, $Q_{20}$, and $Q_{21}$ is made conductive at an output port of a resistor $U_1$ by a command from a control system, such as a CPU 16 or the like.

In the case where the transistors $Q_3$ and $Q_4$ are made operative by the conduction of the transistor $Q_{15}$, the transistors $Q_3$ and $Q_4$ have an amplifying function in a wide range from the DC band since they constitute a common emitter type amplifier in which the feedback circuit between the emitters is formed by only resistors. In the case where the transistors $Q_5$ and $Q_6$ are made operative by the conduction of the transistors $Q_{16}$ and $Q_{17}$, the transistors $Q_5$ and $Q_6$ have an amplifying function in a wide range from a very low frequency although the DC signal is cut-off since they constitute a common emitter type amplifier in which the feedback circuit between the emitters is formed by a capacitor having a large capacitance and a resistor. In the case where the transistors $Q_7$ and $Q_8$ are made operative due to the conduction of the transistors $Q_{18}$ and $Q_{19}$, since the transistors $Q_{18}$ and $Q_{19}$ constitute a common emitter type amplifier in which the feedback circuit between the emitters is formed by a capacitor having a small capacitance and the resistor, the DC signal is cut out (filtered out) and they have an amplifying function in a fairly high frequency range. In the case where the transistors $Q_{19}$ and $Q_{10}$ are made operative by the conduction of the transistors $Q_{20}$ and $Q_{21}$, since the transistors $Q_{19}$ and $Q_{10}$ construct a common emitter type amplifier in which the feedback circuit between the emitters is formed by an inductance and a resistor, they have an amplifying function within a range from the DC band to a predetermined frequency.

In transistor pairs, $Q_{11}$–$Q_{12}$ and $Q_{13}$–$Q_{14}$, emitters are commonly connected, bases of $Q_{11}$ and $Q_{13}$, and of $Q_{12}$ and $Q_{14}$ are connected respectively, and collectors of $Q_{11}$ and $Q_{14}$, and of $Q_{12}$ and $Q_{13}$ are also connected respectively. By applying opposite potentials to control signals POL+ and POL− of the bases, the polarities of the outputs can be inverted. The generating position of the trigger pulse can be set to an increasing slope of the trigger signal or by a decreasing slope by the above circuit. Capacitors $C_{F1}$ and $C_{F2}$ and diodes $CR_{F1}$, $CR_{F2}$, $CR_{F3}$, and $CR_{F4}$ provided on the collector side of the transistors $Q_{11}$, $Q_{12}$, $Q_{13}$, and $Q_{14}$ function as a kind of a low pass filter because the collectors of the transistors $Q_{11}$, $Q_{12}$, $Q_{13}$, and $Q_{14}$ are short-circuited in a high frequency region by the capacitors $C_{F1}$ and $C_{F2}$ due to the conduction of a transistor $Q_{22}$. In many cases, the filter is added in not only the triggering circuit system, but also in the circuit section 10 comprising the CH1/CH2 selecting/adding circuit, signal amplifier, and A/D converter 10a in FIG. 1. Generally, the filter is used in the case where the operator wants to eliminate noise in a high frequency region and to observe the result. The resultant outputs are supplied to transistors $Q_{23}$ and $Q_{24}$ and outputs are supplied to the next stage while keeping the operating point constant by the feedback function of an operational amplifier $U_2$.

Figure 7:
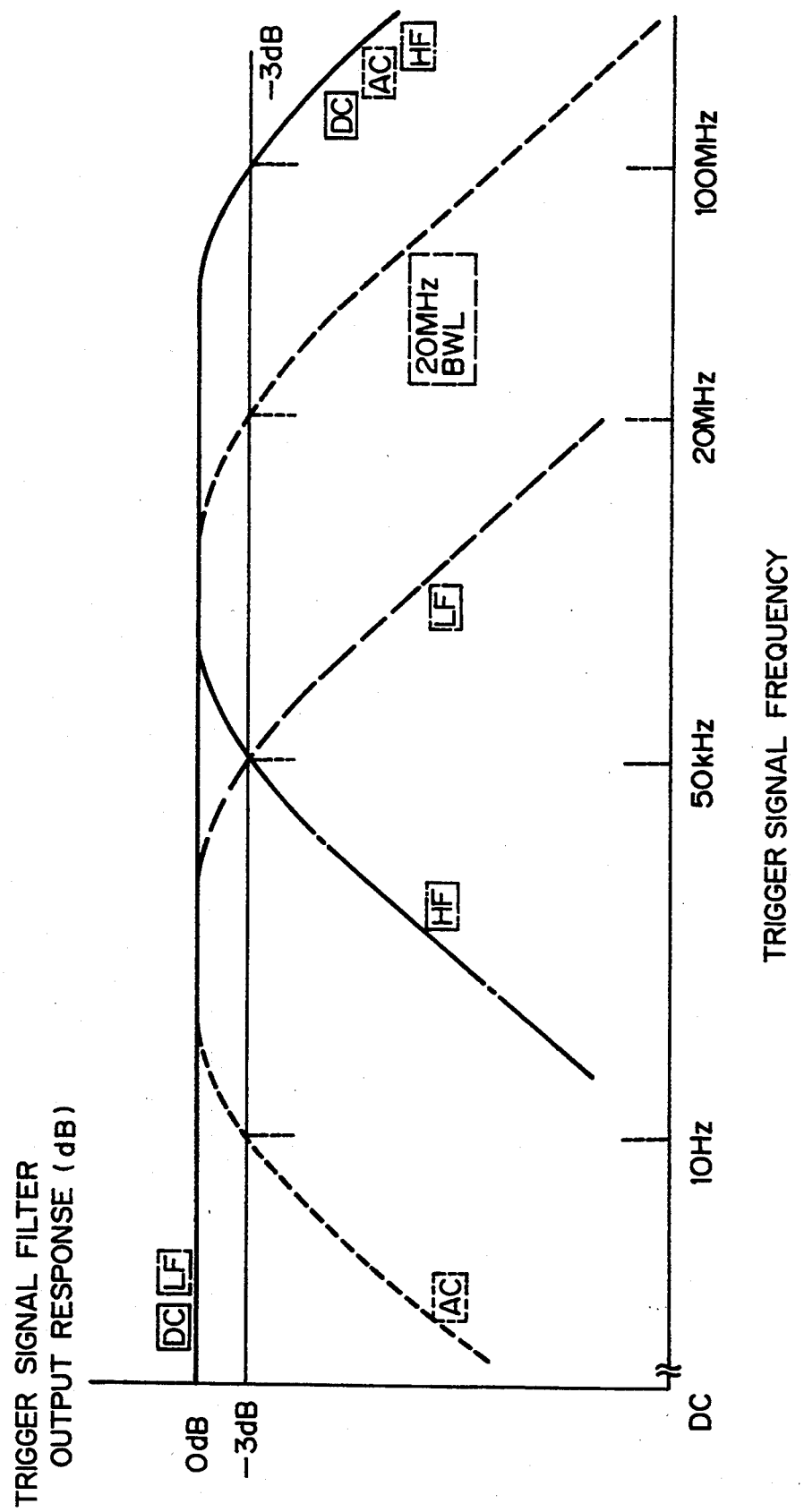
FIG. 7 is a frequency characteristic diagram of the filter for the trigger signal in the first embodiment of the invention.

FIG. 7 shows a typical example of the frequency characteristics of the above-described filter circuit. As an example in which the filter circuit provides an amplifying function in a wide band from the DC band when the transistors $Q_3$ and $Q_4$ shown in FIG. 6 are made operative, the amplifier is constructed to have a band width of up to 100 MHz. Since the signal is amplified to the DC band, it is generally called DC coupling. As an example of a filter circuit having an amplifying function in a wide range from a very low frequency, although the DC signal is cut-off, when the transistors $Q_5$ and $Q_6$ have been made operative an amplifier operative in a frequency range from a low frequency of 10 Hz to a high frequency of 100 MHz is shown. This is called AC coupling since most of the AC components are allowed to pass. As an example of a filter circuit having an amplifying function in only a fairly high frequency range, in which the DC signal is cut-out, when the transistors $Q_7$ and $Q_8$ have been made operative an amplifier operative in a frequency range from a low frequency of 50 kHz to a high frequency of 100 MHz is shown. This is called HF coupling since only frequencies in a high band are allowed to pass. As an example of a filter circuit having an amplifying function in a frequency range from the DC band to a predetermined frequency when the transistors $Q_9$ and $Q_{10}$ have been made operative, an amplifier operative in a frequency range of up to a high frequency of 50 kHz is shown. This is called LF coupling since only the frequencies in a low frequency band are allowed to pass.

Figure 8:
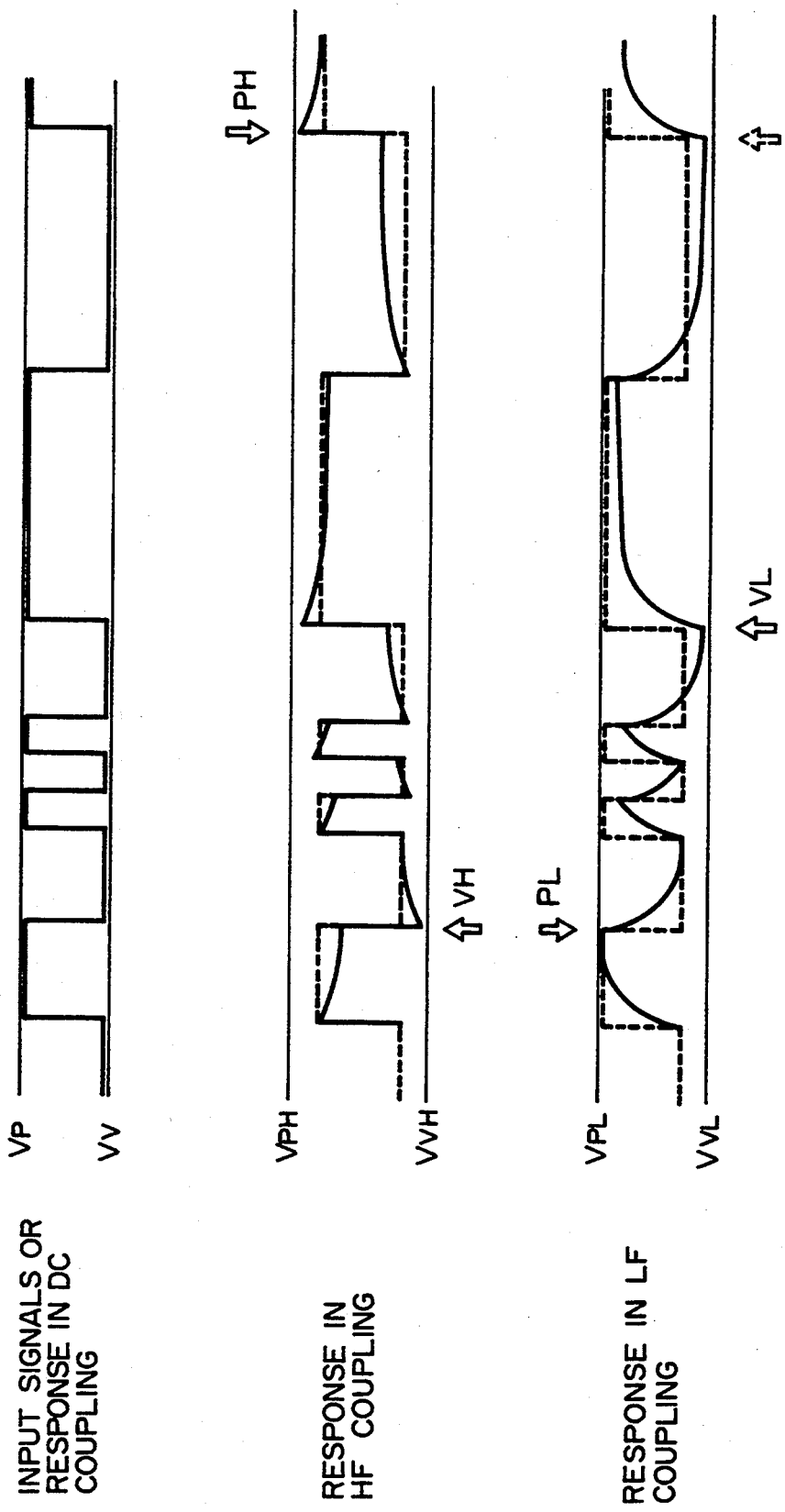
FIG. 8 is a signal waveform diagram showing a difference in the response speed for various types of coupling of the filter for the trigger signal in the first embodiment of the invention.

FIG. 8 shows differences in responses in the case where signals (also called a pulse train) having a predetermined amplitude and different periods are transmitted through the filter circuit. Although the signal is transmitted with a high fidelity in DC coupling, in the case of HF coupling, the signal is subjected to a differentiating function and either one of the change points exhibits a maximum value. On the other hand, in case of LF coupling, the signal is subjected to an integrating function and the signal exhibits the maximum value at a position near the end of the flat portion of the waveform. Consequently, by transmitting the input signal through the above filter circuit, periodicities hidden in the signal can be extracted in all of the frequency bands.

Figure 9:
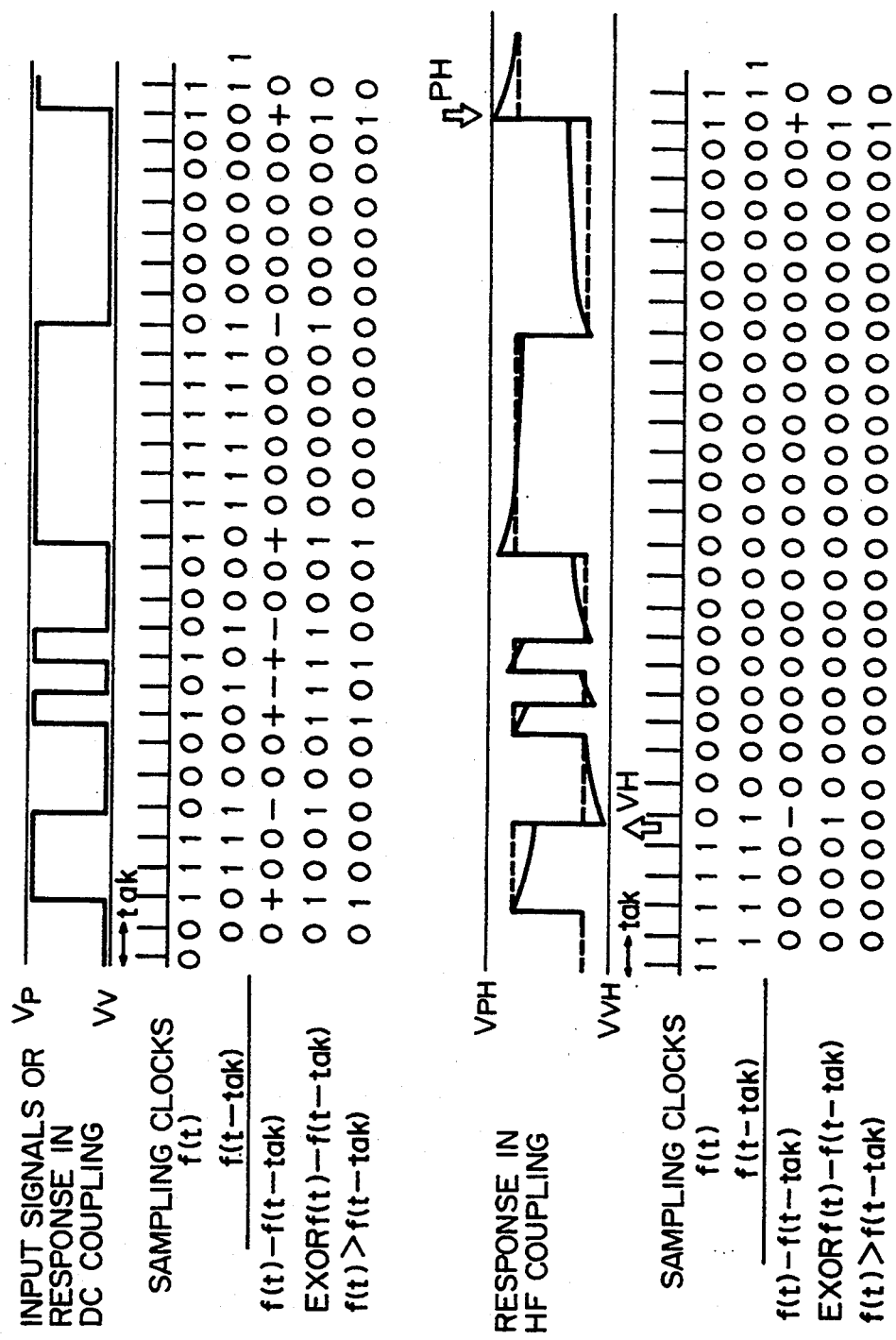
FIG. 9 is a signal data diagram showing differences of the sampled data and the operation results from a difference in the response speed due to the type of coupling of the filter for the trigger signal in the first embodiment of the invention.
Figure 10:
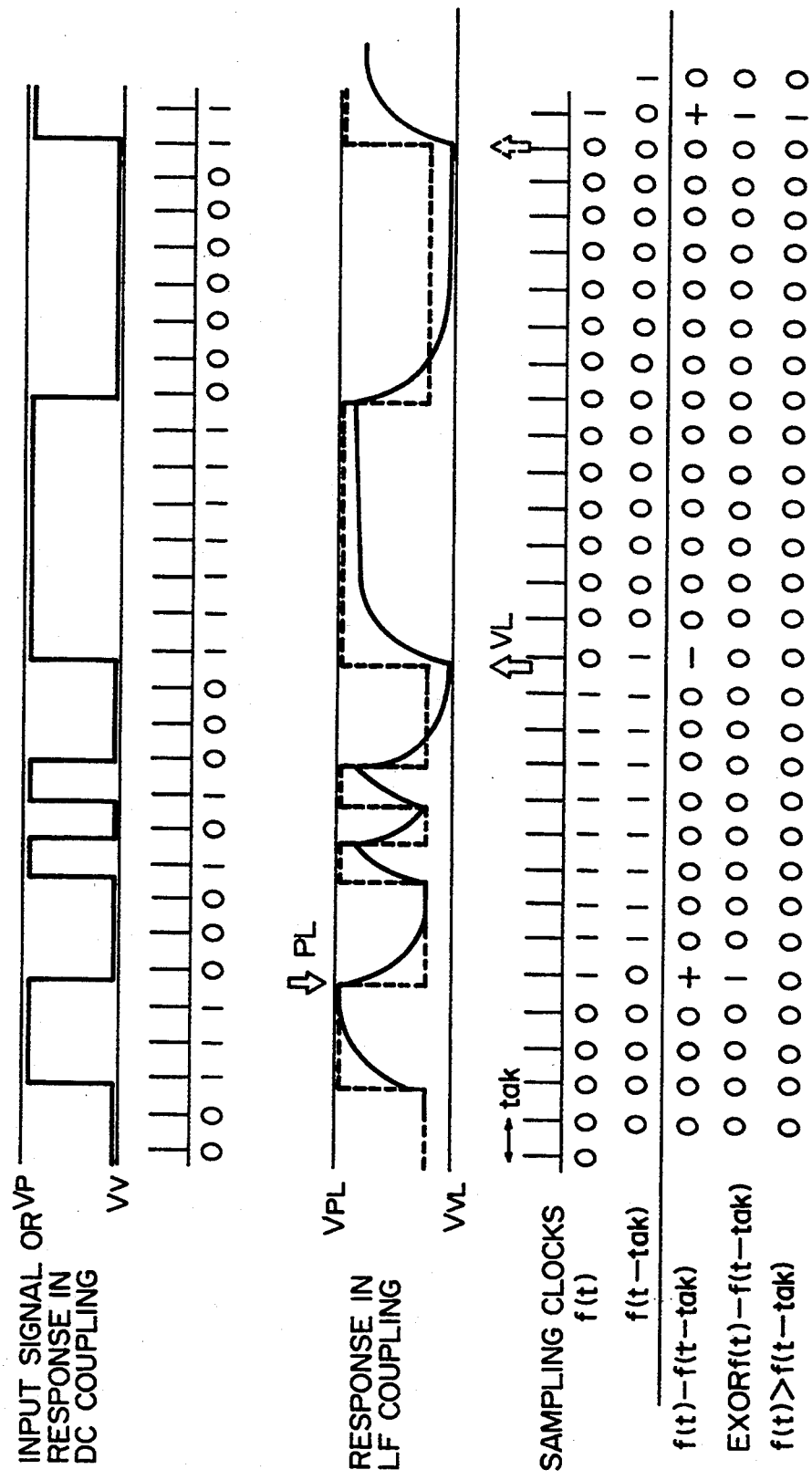
FIG. 10 is a signal data diagram showing differences of the sampled data and the operation results from a difference in this response speed due to the type of coupling of the filter for the trigger signal in the first embodiment of the invention.

FIGS. 9 and 10 show means for practically realizing the extraction of spectra by using the above-described various filters. The diagrams show that the periodicities can be extracted by reading the output of the filter circuit by sampling clocks and by executing simple arithmetic operations on the time sequential data which has been read. In the example of DC coupling, when the time sequential sampling data of f(t) is delayed by a time of one pulse and the resultant data assumes $f(t-t_{clk})$, the polarity (slope) of the change point can be determined from the difference between the above two data set, the maximum and minimum positions can be determined from an exclusive OR operation, and the points indicative of the periods can be determined from the result of a comparison of the magnitudes. As will be obviously understood from FIGS. 9 and 10, various kinds of period components can be fairly clearly detected.

Figure 11:
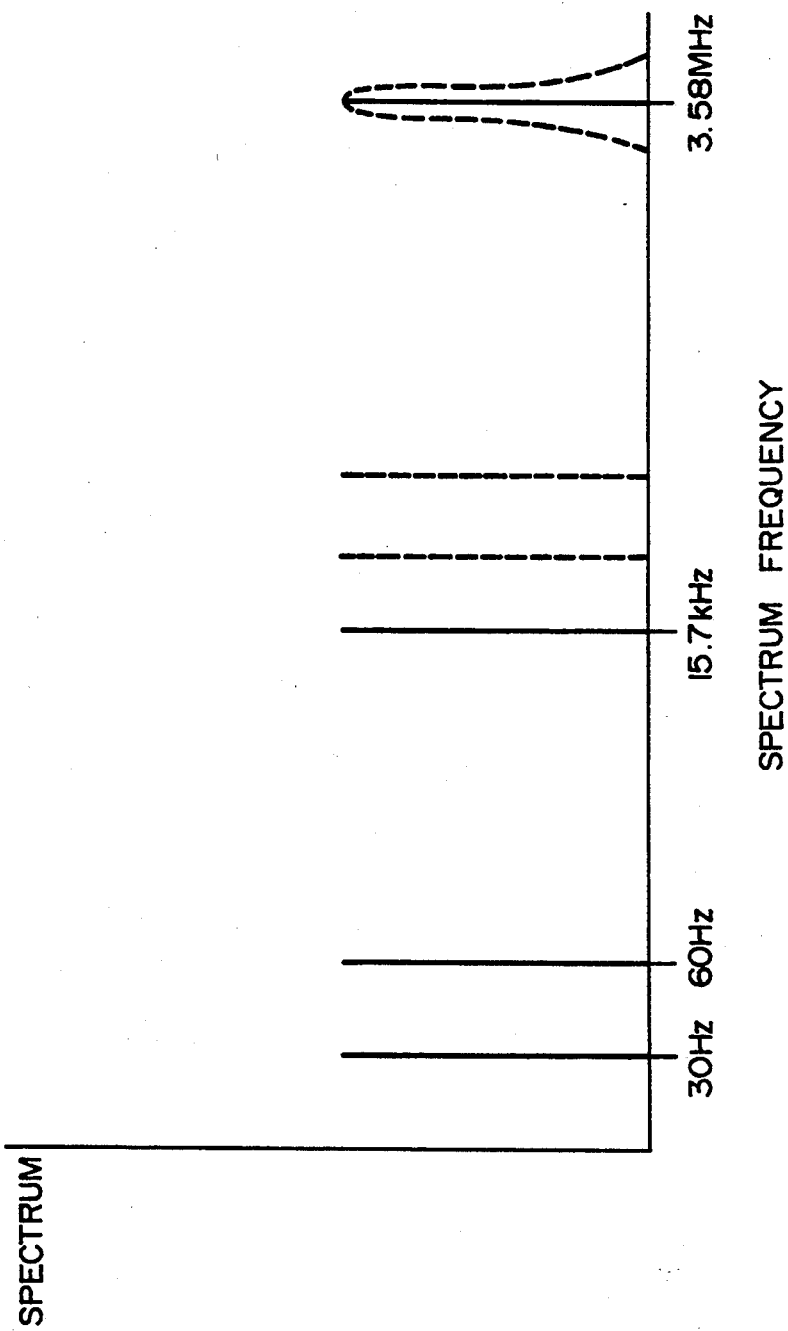
FIG. 11 is a frequency characteristic diagram showing an example of spectral frequencies included in a trigger signal that is obtained by the filter for the trigger signal in the first embodiment of the invention.
Figure 12:
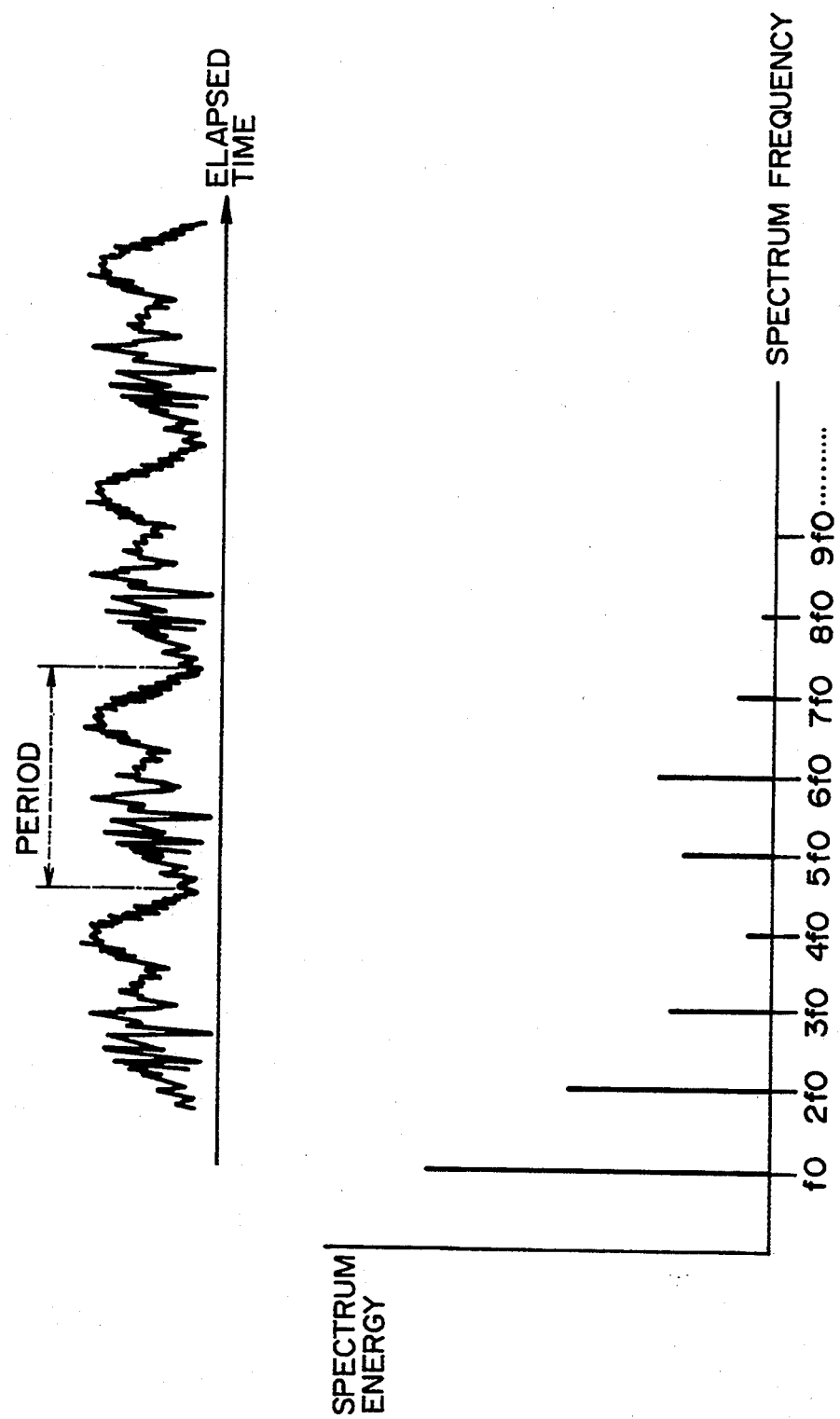
FIG. 12 is a frequency characteristic diagram showing examples of a waveform of a periodicity signal in a natural world which is seen in a musical instrument or the like and its spectrum in the first embodiment of the invention.
Figure 14A:
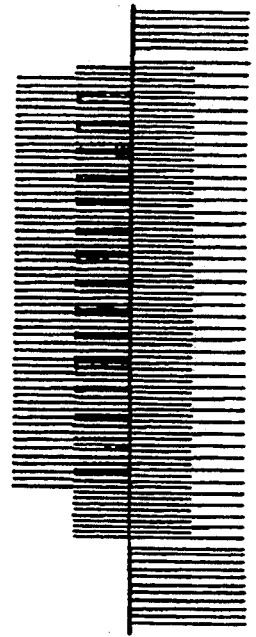
FIG. 14 is a display screen diagram showing an example of the CRT display screen in the second embodiment of the invention.
Figure 14B:
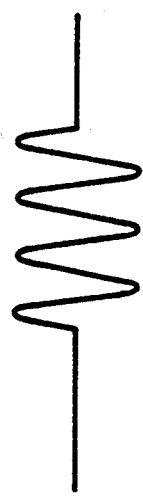
Figure 14C:
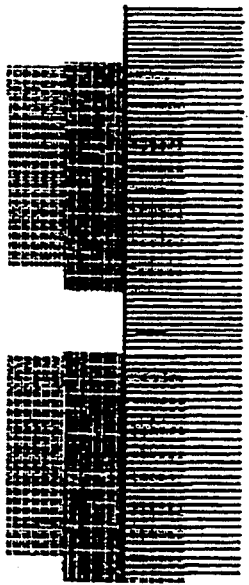
Figure 14D:
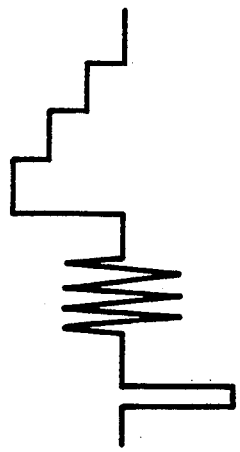

FIG. 11 shows examples of spectra obtained as mentioned above and shows spectrum frequencies of a television signal. FIG. 12 is a diagram showing a signal waveform in the natural world represented by a musical instrument or a voice and shows an example in which all of the high frequency spectra are formed by the harmonics of the repetition frequency as a fundamental frequency. It will be, therefore, understood that it is very important to known the lowest repetition frequency.

The first embodiment comprises: means for displaying, on the CRT screen, waveforms, sweep rates, and triggering conditions with respect to the main period component including the fundamental repetition frequency which has been extracted by the filter 13a for the trigger signal and the level comparator 13b as mentioned above; and means by which the observer can select the waveform which the observer has determined to be the most desired waveform from those waveforms.

FIG. 13 shows some picture plane display examples. With respect to each waveform, the sweep rate and the value of the repetition frequency (triggering condition) are shown and they have been managed as a set of data in the memory 17. Although the observer obviously understands that all of the waveforms shown in FIG. 13 are the correct waveforms, it is most necessary to allow the display of the picture plane which the observer wants to view. Therefore, in the case where the displayed observation waveform is not the waveform that the observer wishes to view, the observer moves a marker to a desired spectrum by using a key on a panel surface of the operating section 20 or the like. Thus, the CPU 16 reads out the necessary waveform data from the memory 17 and allows the waveform, which the observer wishes to view, to be displayed on the screen of the CRT 19 through the display circuit 18.

According to the first embodiment, therefore the oscilloscope comprises: means for extracting main period components included in the signal to be observed; means for displaying, on the screen, the waveform of one of the extracted period components and the information indicating with which period component the waveform is triggered; and means for triggering with another period component and switching the sweep time by input from the operating section. Thus, it is possible to realize an oscilloscope in which the observer can be made free from troubles of the triggering operations and which has a high general-purpose capability without limiting it to a special signal. Since the above processes are fundamentally executed in hardware, there are excellent advantages obtained such that processing speed is high, the number of errors is small, the CPU and the program software can be simply constructed, and it is also sufficient to use a small memory capacity.

(Embodiment 2)

The second embodiment of the invention will now be described. Since the construction of the apparatus of the second embodiment is substantially equal to that of the first embodiment, while including the filter 13a for the trigger signal 13a and the level comparator 13b as means for extracting the main period components included in the signal to be observed as one of the main sections of the second embodiment, different points regarding the operations of the second embodiment, in particular, will now be described.

The operations in the second embodiment differ from those of the first embodiment with respect to the following points. That is, the waveform data stored in the memory 17 is supplied to the display circuit 18 in accordance with the command of the CPU 16 and all of the waveforms for four types of extracted period components which are concerned with each other are displayed together (in a lump) on the same screen of the CRT (cathode ray tube) 19. The information of the triggering conditions and the sweep times indicating with which period components the four types of displayed waveforms are triggered are also displayed. When the displayed waveforms are not the waveforms observer wishes to view, the CPU 16 switches to the waveforms, triggering conditions, and sweep times of four different types of period components, which have been managed as a set of data in the memory 17, by key input regarding the triggering conditions and sweep times from the operating section 20 by the observer and allows them to be displayed on the screen of the CRT 19 through the display circuit 18.

That is, according to the second embodiment, with respect to the main period components including the fundamental repetition frequency extracted by the filter 13a for the trigger signal and the level comparator 13b, the waveforms, sweep rates, and triggering conditions regarding every four types of relative period components are displayed together (in a lump) on the same screen of the CRT. The observer can arbitrarily select the waveforms of the group which the observer determined to be the most desired waveforms from the extracted period components. FIG. 14 shows screen display examples regarding the television signal in the second embodiment. With respect to each waveform, the sweep rate and the value of the repetition frequency (triggering condition) are shown and they have been managed as a set of data in the memory 17 shown in FIG. 1. Although the observer obviously understands that all of the waveforms shown in FIG. 14 are the correct waveforms, it is most desirable to allow display of the desired picture plane for the observer. Therefore, in the case where the displayed observation waveforms are not the desired waveforms, the observer moves the marker to the desired spectrum by using the keys on the panel surface or the like in the operating section 20 shown in FIG. 1. Thus, the CPU 16 reads out the necessary waveform data from the memory 17 and allows the most desired waveforms of the group to be displayed on the screen of the CRT 19 through the display circuit 18.

According to the second embodiment, therefore, the oscilloscope comprises: means for extracting the main period components included in the signal to be observed; means for displaying, on the same screen, the waveforms and the information indicating with which period components those waveforms are triggered with respect to N types of period components among the extracted period components; and means for triggering with a different N types of period components and switching the sweep times by input from the operating section. Therefore, it is possible to realize an oscilloscope in which the observer can be made free from the troubles of the triggering operations, N kinds of relative period components can be observed together (in a lump), and a high generality is obtained without limiting it to a special signal. On the other hand, since the above processes are fundamentally executed in hardware, there are excellent advantages such that a processing speed is high, the number of errors is small, the CPU and software program can be simply constructed, and it is also sufficient to use a small memory capacity.

(Embodiment 3)

The third embodiment of the invention will now be described. Since the construction of the apparatus of the third embodiment is substantially equal to that of the first embodiment, while including the filter 13a for the trigger signal and the level comparator 13b as means for extracting the main period components included in the signal to be observed as one of the main sections of the third embodiment, different points of the operations thereof in particular will now be described.

The operations of the third embodiment differ from those of the first embodiment with respect to the following points. That is, the waveform data stored in the memory 17 is supplied to the display circuit 18 in accordance with a command of the CPU 16, the waveforms of the extracted period components are sequentially displayed on the screen of the CRT (cathode ray tube) 19, and the information of the triggering conditions and sweep rates indicating with which period components the displayed waveforms are triggered is also displayed. On the other hand, when the displayed waveforms or waveforms which had been previously displayed a little time prior are the desired waveforms of the observer, the CPU 16 instructs the display circuit 18 so as to fix the displayed picture planes on the CRT 19 or to return to the previous waveforms by key input, from the operating section 20, by the observer.

That is, according to the third embodiment, with respect to the main period components including the fundamental repetition frequency extracted by the filter 13a for the trigger signal and the level comparator 13b, the waveforms, sweep rates, and triggering conditions are sequentially displayed on the CRT screen and the displayed picture planes are fixed or returned, thereby enabling the waveforms the observer wishes to view to be arbitrarily selected. FIG. 15 shows several display examples of the picture planes according to the third embodiment. With respect to each waveform, the sweep rate and the value of the repetition frequency (triggering condition) are shown and they have been managed as a data set in the memory 17 shown in FIG. 1. Although the observer obviously understands that all of the waveforms shown in FIG. 15 are correct waveforms, it is most desirable to allow display of only the picture planes the observer desires to view. Therefore, the observer looks at the observation waveforms which have been sequentially displayed and, when the desired waveforms are displayed, the observer fixes the present picture planes or returns to previous picture planes displayed a little time before by the instruction from the operating section shown in FIG. 1.

According to the third embodiment, therefore, the oscilloscope comprises: means for extracting the main period components included in the signal to be observed; means for sequentially displaying, on the screen, the waveforms of the extracted period components and the information indicating with which period components the waveforms are triggered; and means for fixing or returning the display screen by the input from the operating section. Therefore, it is possible to realize an oscilloscope in which the observer can be made free from the troubles of the triggering operations, operation is made easy, and a high generality is obtained without limiting the oscilloscope to a special signal. On the other hand, since the above processes are fundamentally executed in hardware, there are excellent advantages such that processing speed is high, the number of errors is small, the CPU and software program can be simply constructed, and it is also sufficient to use a small memory capacity.

(Embodiment 4)

FIG. 16 shows a construction of the fourth means of the invention as a fourth embodiment. In FIG. 16, reference numeral 1 denotes the CH1 input; 2 the CH1 ATT; 3 the CH1 channel amplifier; 4 the CH2 input; 5 the CH2 ATT; 6 the CH2 channel amplifier; 7 the external trigger signal input; 8 the external trigger signal ATT; 9 the external trigger signal amplifier; 10 the circuit section comprising the CH1/CH2 selecting/adding circuit, signal amplifier, and A/D converter; 11 the circuit section comprising the CH1 and CH2 trigger signal amplifiers and trigger signal selecting circuit; 12 the DAC for generating the trigger level voltage; 13 the circuit section comprising the filter for the trigger signal, level comparator, and the like; 14 the circuit section comprising the trigger signal selecting/trigger pulse generating circuit and trigger timing data extracting circuit; 15 the bus; 16 the CPU; 17 the memory; 18 the display circuit; 19 the CRT; 20 the operating section; 21 the sampling clock generating circuit; and 22 a fuzzy logic circuit.

The operation of the fourth embodiment will now be described. The signal to be observed is supplied to the CH1 input 1 or the CH2 input 4 and is adjusted by the attenuator of the CH1 ATT 2 or CH2 ATT 5 so as to have a desired amplitude. Outputs of those attenuators are respectively given to the CH1 channel amplifier 3 or the CH2 channel amplifier 6 and subjected to the necessary amplification. Next, the amplified signals are sent to the circuit section 10 comprising the CH1/CH2 selecting/adding circuit, signal amplifier, and A/D converter. The selected or synthesized resultant signal is converted into the digital signal by the A/D converter 10a. The digital signal is sent to the CPU 16 through the bus 15 and stored in the memory 17. On the other hand, either the signals from the respective channel CH1 and CH2 inputs 1 and 4 or the trigger signal derived from the external trigger signal input 7 are/is selected by the circuit section 11 comprising the CH1 and CH2 trigger signal amplifier and trigger signal selecting circuit. Next, the selected signal is supplied to the circuit section 13 comprising the filter circuit for the trigger signal, level comparator, and the like. The comparison voltage is supplied from the trigger level voltage generating DAC 12 to the input terminal as the comparison signal of the level comparator 13b. All of the trigger features included in the trigger signal are extracted by changing the comparison voltage in the range of the entire signal amplitude after it was transmitted through the filter 13a for the trigger signal. In the output of the level comparator 13b, the trigger timing information is detected by the high speed circuit section 14 comprising the trigger signal selecting/trigger pulse generating circuit and trigger timing data extracting circuit and is sent as data to the CPU 16 via the bus 15. Next, the optimum triggering condition is determined by the fuzzy circuit 22, and the data is stored into the memory 17. The waveform data stored in the memory 17 is supplied to the display circuit 18 in accordance with a command of the CPU 16. The waveform is displayed on the screen of the CRT (cathode ray tube) 19 together with the information of the triggering condition and the sweep rate.

When the displayed waveform is not the desired waveform of the observer, the CPU 16 switches to the waveform, triggering condition, and sweep rate, of another period component, which have been managed as a data set in the memory 17 by key input from the operating section 20 by the observer and allows them to be displayed on the screen of the CRT 19 through the display circuit 18.

Since the filter 13a for the trigger signal and the level comparator 13b acting as means for extracting the main period components included in the signal to be observed, are one of the main sections in the fourth embodiment of the invention and are substantially the same as those shown in the foregoing second embodiment, their detailed descriptions are omitted here.

In the fourth embodiment, the oscilloscope comprises: the fuzzy logic circuit 22 shown in FIG. 16 for deciding the optimum triggering conditions with respect to the main period components including the fundamental repetition frequency extracted by the filter 13a for the trigger signal and the level comparator 13b; means for displaying on the CRT screen the waveform and sweep rates together with the triggering conditions with regard to the period components whose triggering conditions have been determined; and means by which the observer can select the waveform which the observer determined to be the most desired waveform from those waveforms.

In the fuzzy logic circuit 22 for deciding the triggering conditions for the signal to be observed by recognizing the frequency or time sequential pattern, after the frequency spectrum data of the trigger has been detected, membership functions for a fuzzy logic pattern matching are set as shown in FIG. 17. FIG. 17 shows a state in which the membership functions are overlaid on FIG. 12. In example 1, the membership functions are located at frequencies of $f_0$ and $6f_o$. In example 2, the membership functions are located at frequencies of $2f_0$, $3f_0$, and $6f_o$. Although the membership functions are not overlaid for all of the spectra, such patterns are satisfactory so long as the number of peaks is limited.

Figure 18:
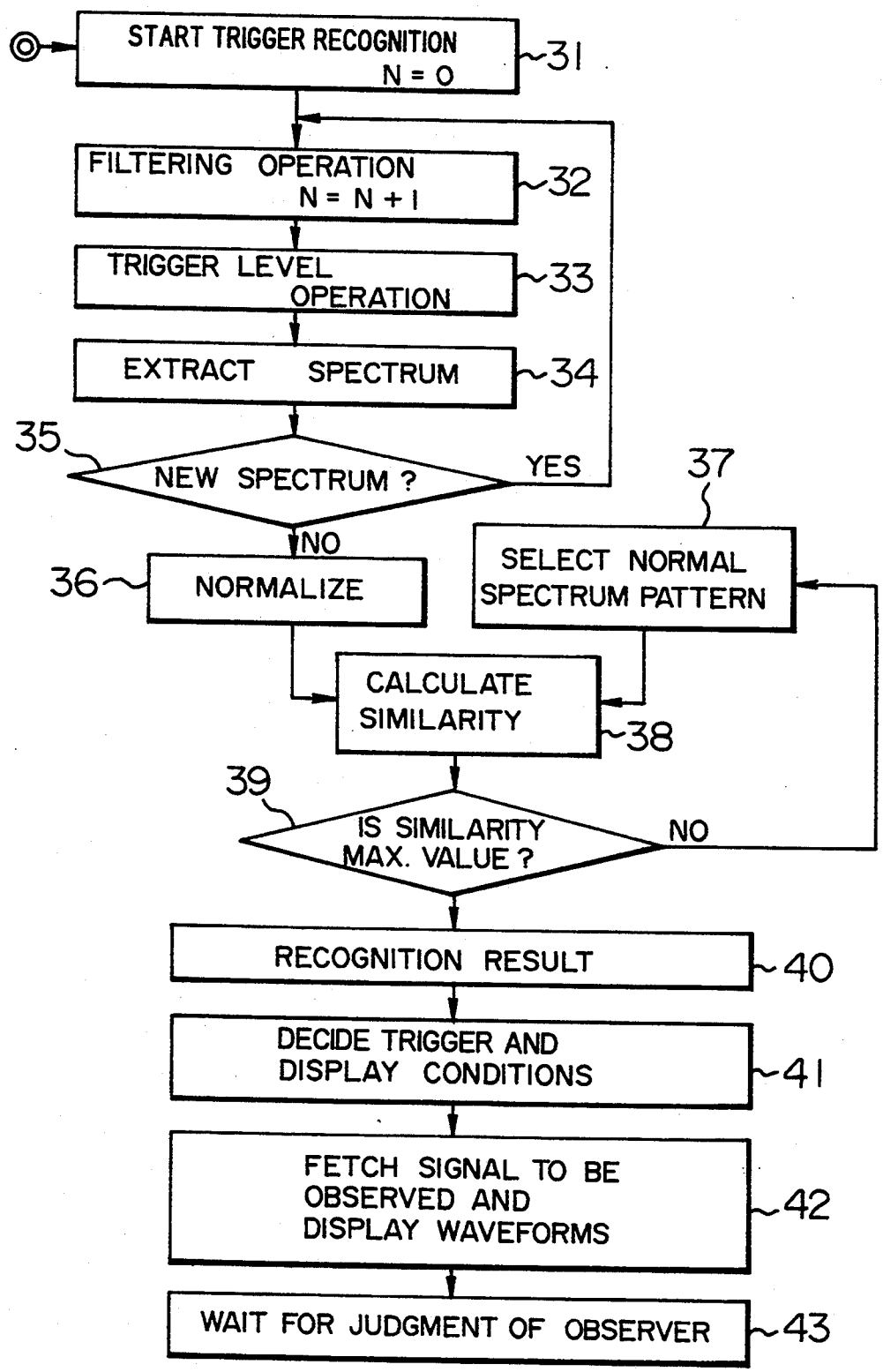
FIG. 18 is a flowchart showing an example of the operation of the fuzzy logic circuit in the fourth embodiment of the invention.

FIG. 18 shows an example of a flowchart of the operations to recognize the frequency spectrum pattern using the fuzzy logic pattern matching. First, when the observer instructs the machine to execute the triggering operation and waveform displaying operation, namely, when the "auto trigger/waveform display" key in the operating section 20 shown in FIG. 16 is depressed, the triggering recognizing operations are started and a loop is initialized (step 31). Subsequently, the selection number of the filter for passing the trigger signal is initialized (step 32). Spectra are detected while changing the trigger level little by little (steps 33, 34, 35). When the spectrum which can be extracted reaches a limit, the matching operation is started. The spectra have previously been normalized by $f_0$ (step 36). A similarity between the normalized spectrum and the standard spectrum pattern selected from the standard spectrum patterns which had been prepared as membership functions is calculated (steps 37, 38). The membership function of the maximum similarity is obtained (step 39). On the basis of the result of the recognition, the conditions of the trigger and waveform display are determined (steps 40, 41). The signal to be observed is triggered and the waveform is displayed on the screen of the CRT 19 (step 42). The observer looks at the displayed waveform and when the waveform differs from the waveform the observer wishes to view, the operation to correct the difference is executed from the operating section 20 (step 43).

In the fourth embodiment as mentioned above, after the frequency spectrum of the trigger signal is normalized on the basis of the fundamental frequency, the fuzzy logic pattern matching process is performed. Therefore, it is sufficient to merely prepare a small number of models of feature parameters and spectrum patterns for the frequency spectrum of an electronic signal irrespective of the frequency band of the unknown trigger signal. The operating speed and the processing precision can be improved.

FIG. 13 shows some screen display examples, regarding the television signal, obtained as mentioned above. The sweep rate and the value of the repetition frequency (triggering condition) with respect to each waveform are shown and they have been managed as a data set in the memory 17. Although the observer obviously understands that all of the waveforms shown in FIG. 13 are the correct waveforms, it is desirable to allow display of the picture planes the observer desires to view. Therefore, when the displayed observation waveforms are not the desired waveforms, the observer moves the marker to the desired spectrum by using the keys on the panel surface of the operating section 20 or the like. Thus, the CPU 16 extracts the necessary waveform data from the memory 17 and allows the waveform the observer most desires to view to be displayed on the screen of the CRT 19 through the display circuit 18.

According to the fourth embodiment, therefore, the oscilloscope comprises: means for extracting the main period components included in the signal to be observed; means for deciding the optimum triggering condition by a fuzzy logic judgment by using a predetermined membership function with respect to each of the extracted period components; and means for displaying the waveform together with the triggering condition on the screen with respect to the period component in which the triggering condition has been determined. Therefore, it is possible to realize an oscilloscope in which the observer can be made free from the troubles of the triggering operations, the trigger setting can be easily performed, and a high generality is obtained without limiting the oscilloscope to a special signal. Since the above processes are fundamentally executed in hardware, there are excellent advantages such that the processing speed is high, the number of errors is small, the CPU and software program can be simply constructed, and it is also sufficient to use a small memory capacity.

(Embodiment 5)

Figure 19:
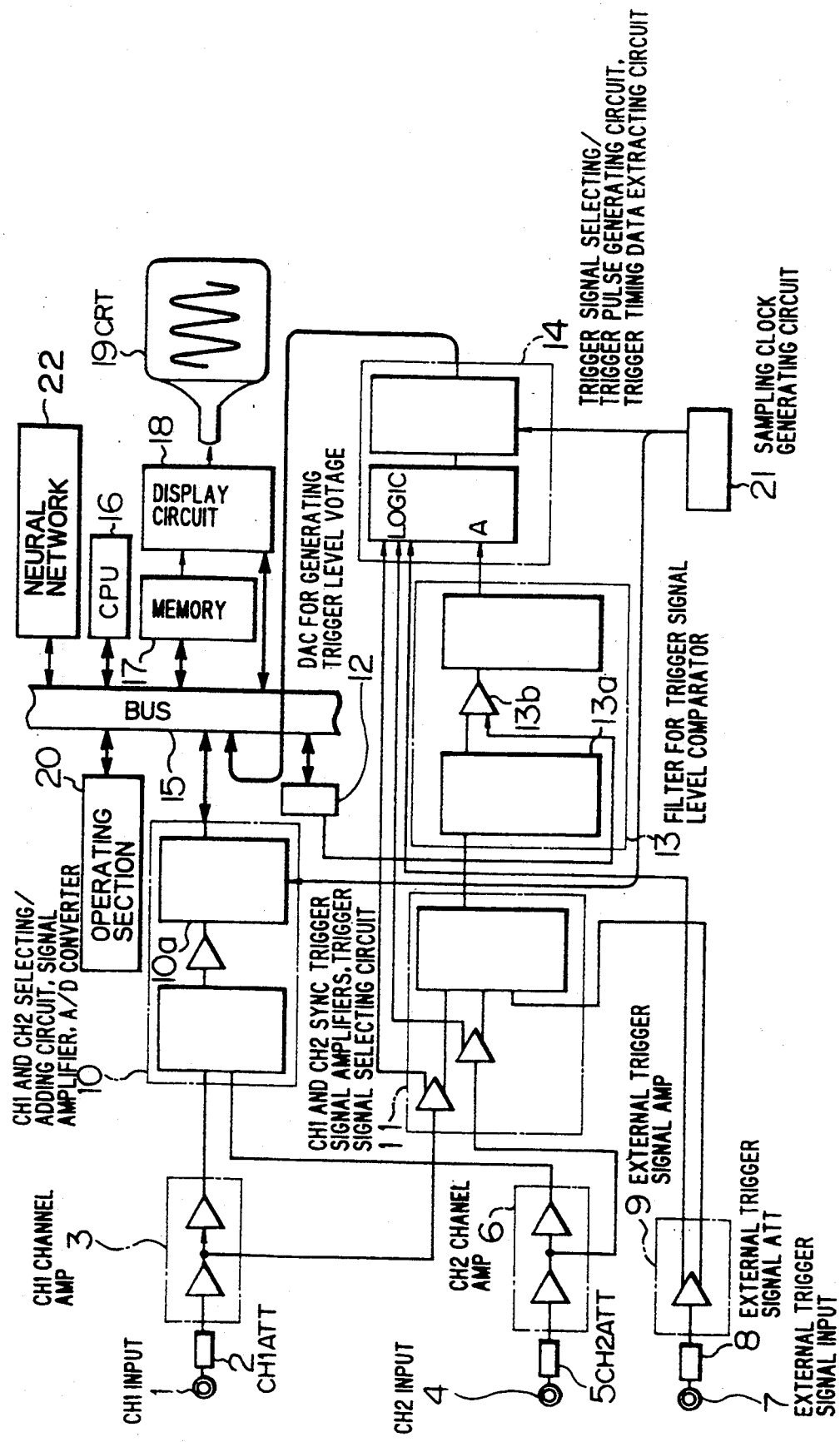
FIG. 19 is a block diagram of an oscilloscope showing the fifth embodiment of the invention.

FIG. 19 shows the construction of the fifth embodiment in a manner similar to the foregoing third and fourth embodiments. In FIG. 19, reference numeral 1 denotes the CH1 input; 2 the CH1 ATT; 3 the CH1 channel amplifier; 4 the CH2 input; 5 the CH2 ATT; 6 the CH2 channel amplifier; 7 the external trigger signal input; 8 the external trigger signal ATT; 9 the external trigger signal amplifier; 10 the circuit section comprising a CH1/CH2 selecting/ adding circuit, a signal amplifier, and an A/D converter; 11 the circuit section comprising the CH1 and CH2 trigger signal amplifiers and a trigger signal selecting circuit; 12 the DAC for generating the trigger level voltage; 13 the circuit section comprising a filter for the trigger signal, a level comparator, and the like; 14 the circuit section comprising a trigger signal selecting/trigger pulse generating circuit and a trigger timing data extracting circuit; 15 the bus; 16 the CPU; 17 the memory; 18 the display circuit; 19 the CRT; 20 the operating section; 21 the sampling clock generating circuit; and 22 a neural network.

The operation of the fifth embodiment will now be described. The signal to be observed is supplied to the CH1 input 1 or the CH2 input 4 and is adjusted by the attenuator in the CH1 ATT 2 or CH2 ATT 5 so as to have a desired amplitude. Outputs of the attenuators are respectively supplied to the CH1 channel amplifier 3 or CH2 channel amplifier 6 and are subjected to necessary amplification. Next, the amplified signals are sent to the circuit section 10 comprising the CH1/CH2 selecting-/adding circuit; signal amplifier, and A/D converter 10. The selected or synthesized signal is converted into a digital signal by the A/D converter 10a. The digital signal is sent to the CPU 16 via the bus 15 and stored in the memory 17. On the other hand, either the signals from the channel CH1 and CH2 inputs 1 and 4 or the trigger signal derived from the external trigger signal input 7 is selected by the circuit section 11 comprising the CH1 and CH2 trigger signal amplifiers and the trigger signal selecting circuit. Then, the selected signal is supplied to the circuit section 13 comprising the filter for the trigger signal, level comparator, and the like. The comparison voltage is supplied from the trigger level voltage generating DAC 12 to the comparison signal input terminal of the level comparator 13b. All of the trigger features included in the trigger signal are extracted by changing the comparison voltage in a range of the entire signal amplitude after being transmitted through the filter 13a for the trigger signal. In the output of the level comparator 13b, the timing information of the trigger is detected by the high speed circuit section 14 comprising the trigger signal selecting/trigger pulse generating circuit and the trigger timing data extracting circuit and is sent as data to the CPU 16 via the bus 15 and stored in the memory 17. The waveform data stored in the memory 17 is supplied to the display circuit 18 in accordance with an instruction from the CPU 16. The waveform of one extracted period component is displayed on the screen of the CRT (cathode ray tube) 19 and the information of the triggering condition and sweep rate indicating with which period component the displayed waveform is triggered is also displayed. When the displayed waveform is not the waveform the observer wishes to view, the neural network 22 changes the coupling coefficient between the processing units on the basis of a teaching signal input from the operating section 20 input by the observer and the neural network 22 learns to provide the desired waveform of the observer.

Since the filter 13a for the trigger signal and the level comparator 13b, which act as means for extracting the main period components included in the signal to be observed as one of the main section in the fifth embodiment of the invention, are substantially the same as those in the foregoing first embodiment, their detailed descriptions are omitted here.

In the fifth embodiment, a neural network 22 is provided which is constructed in a manner such that, with respect to the main period components included in the fundamental repetition frequency extracted by the filter 13a for the trigger signal and the level comparator 13b, the optimum conditions of the trigger and waveform display are obtained and by being supplied with the teaching signal from the operating section 20 for the waveform displayed on the screen, the optimum conditions of the trigger and waveform display are learned.

The neural network is one of the information processing methods devised on the basis of information processing systems of organisms. A unit corresponding to a nerve cell is called a processing unit. A coupling which connects the nerve cells is called an inter-unit coupling. Different processing functions can be obtained by changing the method of deciding the coefficients of the inter-unit coupling.

Figure 20:
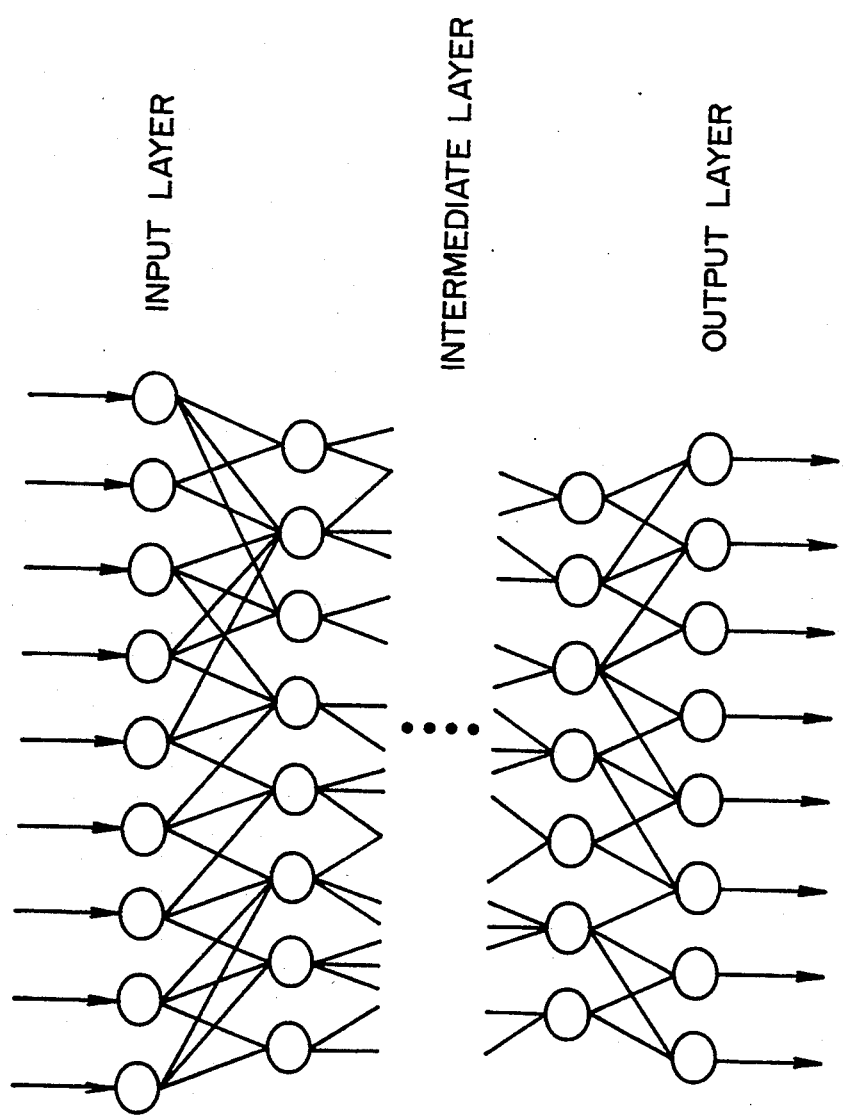
FIG. 20 is a diagram showing a fundamental construction of a neural network in the fifth embodiment of the invention.

As shown in FIG. 20, the neural network 22 has a hierarchy structure comprising an input layer, an intermediate layer, and an output layer. Each layer consists of a plurality of units. Upon recognition, the neutral network 22 operates so as to provide the maximum similarity output of the output layer, while selecting a model by using a dynamic planning method. The neural network learns by using various conditions of the trigger and waveform display which have actually been used in the observation by the observer as a teaching signal and corrects the coefficients of the inter-unit coupling so as to minimize the difference between the output value of the output layer and the output value by the teaching signal. Please refer to "Nikkei Electronics", Vol. 427, pages 115 to 124, Aug. 10, 1987, or the like.

Figure 21:
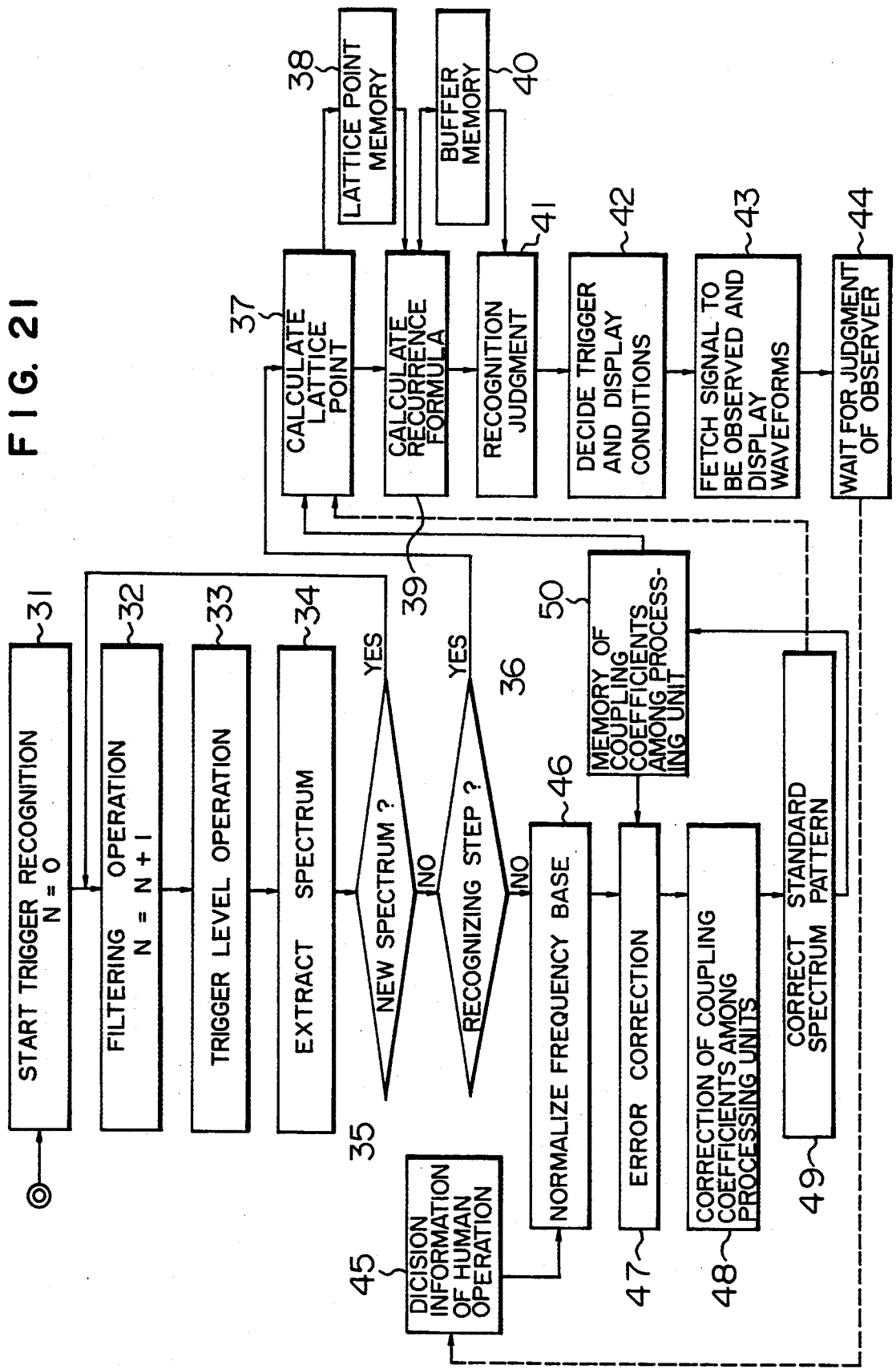
FIG. 21 is a flowchart showing an example of the operation of the neural network in the fifth embodiment of the invention.

FIG. 21 shows a flowchart for the above embodiment using the neural network 22. First, when the observer instructs the machine to execute the triggering and waveform displaying operations, that is, when the "auto trigger waveform display" key of the operating section 20 is depressed, the trigger recognizing operation is started and the loop is initialized (step 31). The selection number of the filter for passing the trigger signal is initialized (step 32). Subsequently, the spectrum is extracted, while changing the trigger level little by little (steps 33, 34, 35). When the spectrum which can be extracted reaches a limit, the recognizing step is started (step 36). In the recognizing operation, a calculation at a lattice point is first executed by using the spectrum as a center (step 37). The lattice data is stored into a lattice point memory (step 38). The lattice data is also used to calculate a recurrence formula, the recognition is judged while storing the data into a buffer memory, and the triggering and displaying conditions are determined (steps 39, 40, 41, 42). On the basis of the result of the recognition, the signal to be observed is triggered and the waveform is displayed on the screen of the CRT (step 43). The observer views at the displayed waveform (step 44). When the displayed waveform is not the desired waveform the observer wishes to view, the observer executes the operation to correct the difference by the input from the operating section 20 (step 45). The learning step is started by using the added operation information as a teaching signal. First, a frequency axis is normalized (step 46). Next, the errors are corrected (step 47). The coupling coefficients, among the processing units of the neural network, are corrected (step 48). The standard spectrum patterns are corrected (step 49) and stored into a coupling coefficient memory (step 50). Next, the triggering and displaying conditions are again determined, the waveform is displayed on the screen, and the above processing steps are repeated until the observer's desired waveform is obtained.

According to the embodiment mentioned above, after completion of the normalization on the basis of the fundamental frequency of the frequency spectrum of the trigger signal, the processes of the neural network are executed. Therefore, it is sufficient to merely prepare a small number of models of the feature parameters and spectrum patterns for the frequency spectrum of the electronic signal irrespective of the frequency band of an unknown trigger signal. Thus, the operating speed and the processing precision can be improved.

FIG. 13 shows some display examples of the picture planes with respect to the television signal obtained as mentioned above. The sweep rate and the value of the repetition frequency (triggering condition) for each waveform are shown and they have been managed as a data set in the memory 17. Although the observer obviously understands that all of the waveforms shown in FIG. 13 are the correct waveforms, it is desirable to allow display of the picture planes the observer desires to view. Therefore, when the observation waveforms displayed automatically by the machine are not the desired waveforms, the observer moves the marker to the desired spectrum by keys on the panel surface of the operating section 20 or the like. Thus, the CPU 16 extracts the necessary waveform data from the memory 17 and allows the waveforms the observer most desires to view to be displayed on the screen of the CRT 19 through the display circuit 18.

According to the fifth embodiment, therefore, the oscilloscope comprises: means for extracting the main period components included in the signal to be observed; and the means for obtaining the optimum conditions of the trigger and waveform display with respect to each of the extracted period components and receiving a teaching signal from the operating section for the waveforms displayed on the screen, thereby learning the optimum conditions of the trigger and waveform display. Therefore, it is possible to realize an oscilloscope in which the observer can be freed from the troubles of triggering operations, the trigger setting can be easily performed, and a high generality is obtained without limiting the oscilloscope to a special signal. On the other hand, since the above processes are fundamentally executed in hardware, there are excellent advantages such that the processing speed is high, the number of errors is small, the CPU and software program can be simply constructed, and it is also sufficient to use a small memory capacity.

I claim:

1. An oscilloscope comprising:
   means for extracting main period components included in a signal to be observed;
   means for displaying waveforms regarding the extracted period components and information indicating with which period components the waveforms are triggered on a screen; and
   means for triggering with other period components selected from said extracted main period components by an input from an operating section.

2. An oscilloscope according to claim 1, wherein said means for triggering with other period components comprises means for switching a sweep time by said input from said operating section.

3. An oscilloscope according to claim 2, wherein input signals and a predetermined reference signal are compared and only the input signals exceeding said reference signal are detected as period components, and said comparison is sequentially executed while changing the reference signal.

4. An oscilloscope according to claim 2, wherein with respect to one of the extracted period components, the waveform of said one extracted period component and information indicating with which period component said waveform is triggered are displayed.

5. An oscilloscope according to claim 2, comprising:
   means for displaying on said waveform display means the individual waveforms regarding a plurality of kinds of period components among said extracted period components and information indicating with which period components said waveforms are triggered; and
   means for triggering with other plurality of kinds of period components different from the period components displayed at present on said waveform display means and switching the sweep times by an input from the operating section.

6. An oscilloscope according to claim 5, wherein input signals and a predetermined reference signal are compared, only the input signals exceeding said reference signal are detected as period components, and said comparison is sequentially executed while changing the reference signal.

7. An oscilloscope according to claim 2, comprising:
   means for sequentially displaying the waveforms about said extracted period components and information indicating with which period components said waveforms are triggered on said waveform display means; and
   means for fixing said waveform display means or displaying upon said waveform display means waveforms which were displayed in the past by an input from the operating section.

8. An oscilloscope according to claim 7, wherein input signals and a predetermined reference signal are compared, only the signals exceeding said reference signal are detected as period components, and said comparison is sequentially executed while changing the reference signal.

9. An oscilloscope comprising:
   means for extracting main period components included in a signal to be observed;
   means for deciding optimum triggering conditions by predetermined membership functions with respect to each of the extracted period components by a fuzzy logic judgment; and
   means for displaying waveforms about the period components on a screen together with the triggering conditions.

10. An oscilloscope according to claim 9, wherein input signals and a predetermined reference signal are compared, only the signals exceeding said reference signal are detected as period components, and said comparison is sequentially executed while changing the reference signal.

11. An oscilloscope comprising:

means for extracting main period components included in a signal to be observed; and means for obtaining optimum conditions of the trigger and waveform display with respect to each of the extracted period components and receiving a teaching signal from an operating section for the waveforms displayed on a screen, thereby learning the optimum conditions of the trigger and waveform display.

12. An oscilloscope according to claim 11, wherein input signals and a predetermined reference signal are compared, only the signals exceeding said reference signal are detected as period components, and said comparison is sequentially executed by changing the reference signal.

* * * * *